(12) United States Patent
Jeon et al.

(10) Patent No.: US 11,942,488 B2
(45) Date of Patent: Mar. 26, 2024

(54) DISPLAY DEVICE AND METHOD OF FABRICATING THE SAME

(71) Applicant: SAMSUNG DISPLAY CO., LTD., Yongin-si (KR)

(72) Inventors: Kyung Jin Jeon, Incheon (KR); So Young Koo, Yongin-si (KR); Eok Su Kim, Seoul (KR); Hyung Jun Kim, Seoul (KR); Joon Seok Park, Yongin-si (KR); Jun Hyung Lim, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/193,200

(22) Filed: Mar. 30, 2023

(65) Prior Publication Data

US 2023/0253415 A1    Aug. 10, 2023

Related U.S. Application Data

(62) Division of application No. 17/109,601, filed on Dec. 2, 2020, now Pat. No. 11,626,426.

(30) Foreign Application Priority Data

Feb. 7, 2020    (KR) .................... 10-2020-0014723

(51) Int. Cl.
    *H01L 27/14*    (2006.01)
    *H01L 27/12*    (2006.01)
    *H10K 59/131*   (2023.01)

(52) U.S. Cl.
    CPC ........ *H01L 27/124* (2013.01); *H01L 27/1262* (2013.01); *H10K 59/131* (2023.02)

(58) Field of Classification Search
    CPC ............... H01L 27/124; H01L 27/1262; H01L 27/1225; H01L 27/1214; H01L 29/786;
    (Continued)

(56) References Cited

U.S. PATENT DOCUMENTS

2021/0366942 A1*  11/2021  Zhou ................... H01L 27/1288

FOREIGN PATENT DOCUMENTS

KR    10-2014-0108026 A    9/2014
KR    10-2017-0070937 A    6/2017
(Continued)

*Primary Examiner* — Tan N Tran
(74) *Attorney, Agent, or Firm* — Lewis Roca Rothgerber Christie LLP

(57) ABSTRACT

A display device includes: a substrate; a first conductive layer on the substrate and comprising a first signal line; an insulating layer pattern on the first conductive layer; a semiconductor pattern on the insulating layer pattern; a gate insulating layer on the semiconductor pattern; and a second conductive layer comprising a gate electrode on the gate insulting layer and a first source/drain electrode and a second source/drain electrode, each on at least a part of the semiconductor pattern, wherein the insulating layer pattern and the semiconductor pattern have a same planar shape, the semiconductor pattern comprises a channel region overlapping the gate electrode, a first source/drain region on a first side of the channel region and a second source/drain region on a second side of the channel region, and the first source/drain electrode electrically connects the first source/drain region and the first signal line.

5 Claims, 25 Drawing Sheets

110: 111, 112, 113, 114
120: 121, 122, 123
130: 131, 132, 133
GI: GI1, GI2, GI3
140: 141a, 141b, 142a, 142b, 142c, 143
150: 151, 152, 153

(58) Field of Classification Search
CPC ............. H10K 59/131; H10K 59/1201; H10K 59/1213; H10K 59/1216; H10K 59/123; H10K 59/124; H10K 59/1315; H10K 59/122; G02F 1/1362; G02F 1/136213
USPC ..................................................... 257/59, 72
See application file for complete search history.

(56) References Cited

FOREIGN PATENT DOCUMENTS

| | | |
|---|---|---|
| KR | 10-1880721 B1 | 7/2018 |
| KR | 10-2019-0048390 A | 5/2019 |

\* cited by examiner

Fig. 1
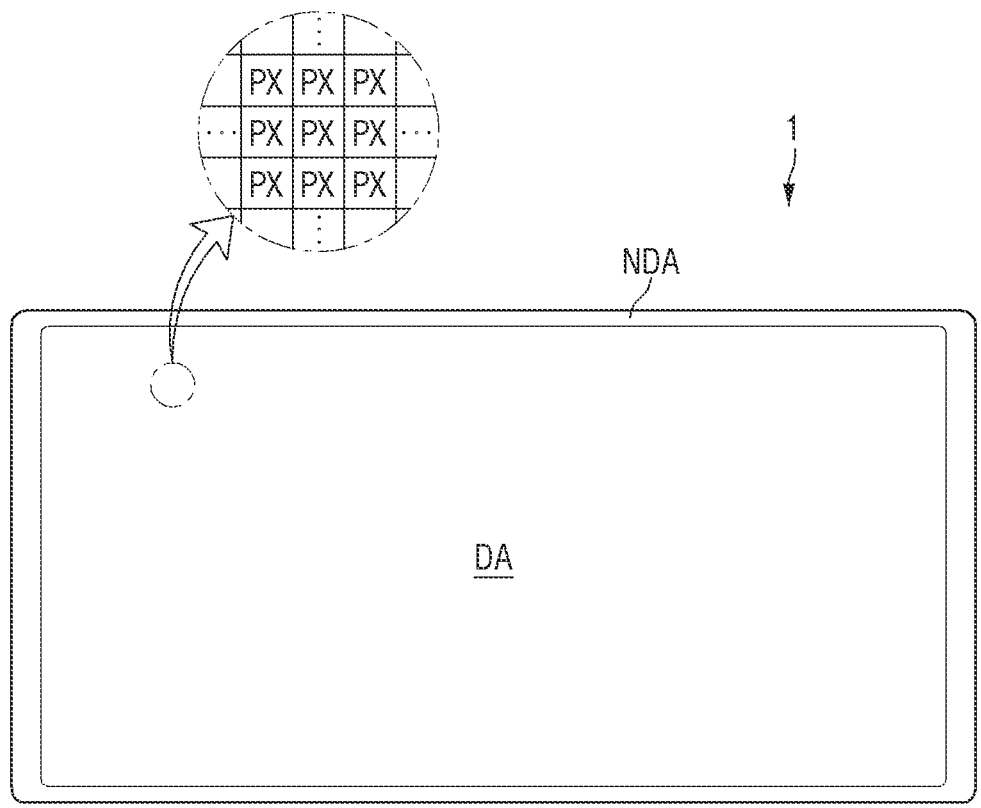
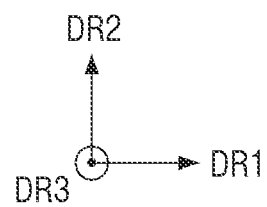

130_1: 131, 132, 133_1

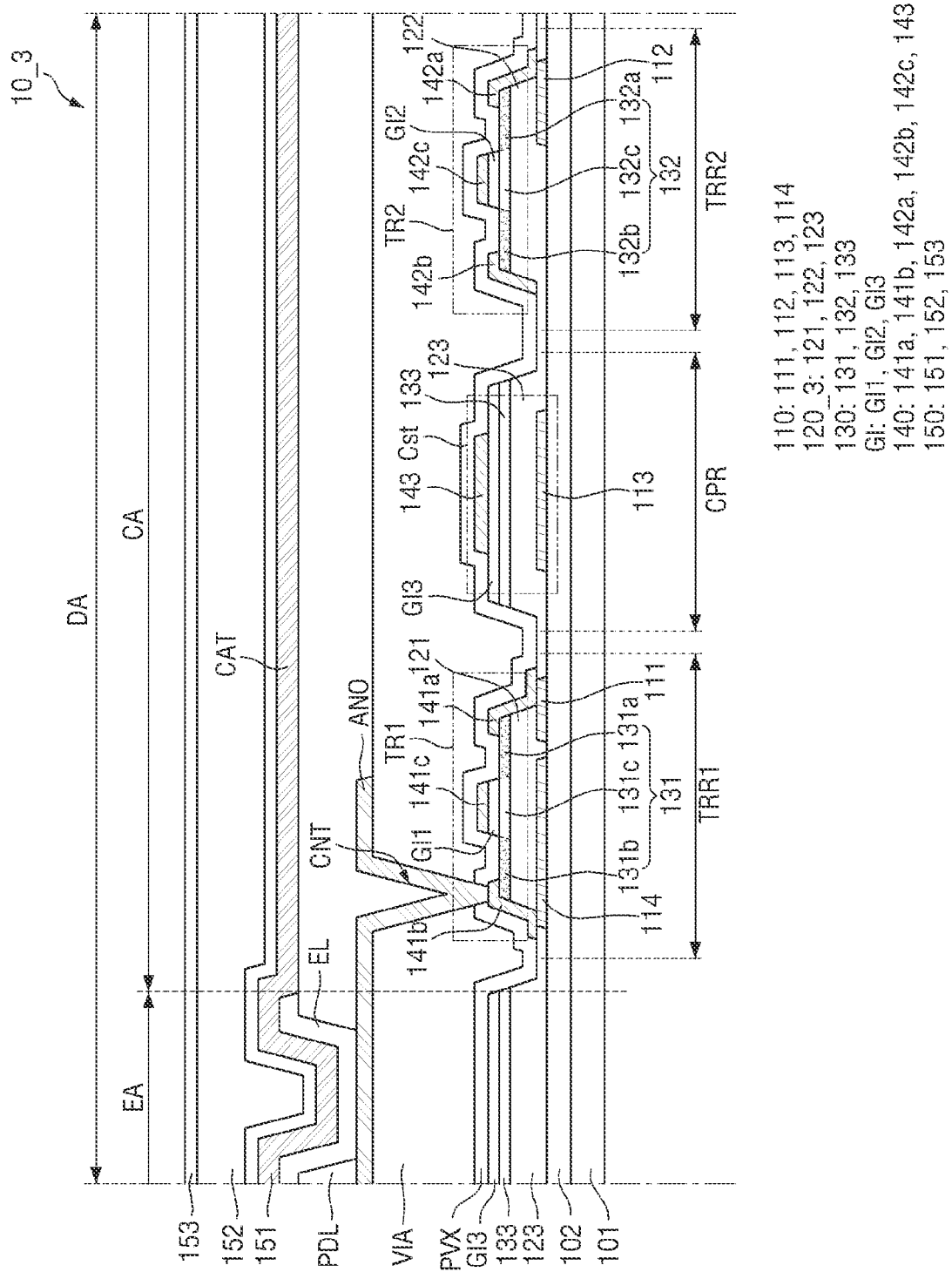

DISPLAY DEVICE AND METHOD OF FABRICATING THE SAME

CROSS-REFERENCE TO RELATED APPLICATIONS

This application is a divisional of U.S. patent application Ser. No. 17/109,601, filed Dec. 2, 2020, which claims priority to and the benefit of Korean Patent Application No. 10-2020-0014723, filed Feb. 7, 2020, the entire content of both of which is incorporated herein by reference.

BACKGROUND

1. Field

Aspects of some example embodiments of the present disclosure relate to a display device and a method of fabricating the same.

2. Description of the Related Art

Electronic devices that display images to users, such as televisions, smartphones, tablet personal computers (PCs), digital cameras, notebook computers and navigation devices, include a display device for displaying the images.

A display device may include a plurality of pixels and a pixel circuit for driving each of the pixels. Each pixel circuit is formed using a wiring and a thin-film transistor formed on an insulating substrate.

The display device may be formed through a plurality of mask processes. The mask processes may be useful for patterning wirings or insulating layers. However, process efficiency may be reduced as the number of mask process steps increases.

The above information disclosed in this Background section is only for enhancement of understanding of the background and therefore the information discussed in this Background section does not necessarily constitute prior art.

SUMMARY

Aspects of some example embodiments of the present disclosure provide a display device fabricated using a relatively reduced number of masks, thereby improving manufacturing efficiency and reducing manufacturing costs.

Aspects of some example embodiments of the present disclosure also provide a method of fabricating a display device using a relatively reduced number of masks.

However, aspects of embodiments according to the present disclosure are not restricted to those set forth herein. The above and other aspects of the present disclosure will become more apparent to one of ordinary skill in the art to which the present disclosure pertains by referencing the detailed description of the present disclosure given below.

According to some example embodiments of the present disclosure, a display device includes a substrate, a first conductive layer on the substrate and comprising a first signal line, an insulating layer pattern on the first conductive layer, a semiconductor pattern on the insulating layer pattern, a gate insulating layer on the semiconductor pattern, and a second conductive layer comprising a gate electrode on the gate insulting layer and a first source/drain electrode and a second source/drain electrode, each on at least a part of the semiconductor pattern, wherein the insulating layer pattern and the semiconductor pattern have a same planar shape, the semiconductor pattern comprises a channel region overlapping the gate electrode, a first source/drain region on a first side of the channel region and a second source/drain region on a second side of the channel region, and the first source/drain electrode electrically connects the first source/drain region and the first signal line.

According to some example embodiments of the present disclosure, a display device includes a substrate, a first conductive layer on the substrate and comprising a data line and a first power wiring, a first insulating layer pattern and a second insulating layer pattern on the first conductive layer, a semiconductor pattern comprising a first semiconductor pattern on the first insulating layer pattern and having the same planar shape as the first insulating layer pattern and a second semiconductor pattern on the second insulating layer pattern and having a same planar shape as the second insulating layer pattern, a gate insulating layer on the semiconductor pattern, a second conductive layer comprising a first gate electrode and a second gate electrode arranged on the gate insulting layer and comprises a first source/drain electrode, a second source/drain electrode, a third source/drain electrode and a fourth source/drain electrode, each on at least a part of the semiconductor pattern, an interlayer insulating film which is arranged on the second conductive layer, and a pixel electrode on the interlayer insulating film, wherein the first gate electrode overlaps the first semiconductor pattern, the second gate electrode overlaps the second semiconductor pattern, the first semiconductor pattern comprises a first channel region overlapping the first gate electrode, a first source/drain region on a side of the first channel region and a second source/drain region on the other side of the first channel region, the second semiconductor pattern comprises a second channel region overlapping the second gate electrode, a third source/drain region on a first side of the second channel region and a fourth source/drain region on a second side of the second channel region, the first source/drain electrode electrically connects the first source/drain region and the data line, the second source/drain electrode electrically connects the second source/drain region and the first gate electrode, the third source/drain electrode electrically connects the third source/drain region and the power wiring, and the fourth source/drain electrode electrically connects the fourth source/drain region and the pixel electrode.

According to some example embodiments of the present disclosure, in a method of fabricating a display device including a plurality of pixels and a first transistor and a second transistor in each of the pixels, the method includes forming a first conductive layer, which comprises a first power wiring electrically connected to a first source/drain electrode of the first transistor, a lower light blocking pattern electrically connected to a second source/drain electrode of the first transistor and a data wiring electrically connected to a first source/drain electrode of the second transistor, on a substrate, sequentially coating an insulating layer material, a semiconductor layer material and a gate insulating layer material on the substrate to cover the first conductive layer, and etching the gate insulating layer material, the semiconductor layer material and the insulating layer material by using a halftone mask to pattern a gate insulating layer which comprises a gate insulating layer of the first transistor and a gate insulating layer of the second transistor, a semiconductor layer comprising a semiconductor pattern of the first transistor and a semiconductor pattern of the second transistor, and an insulating comprising a first insulating pattern having the same planar shape as the semiconductor pattern of the first transistor and a second insulating pattern having a same planar shape as the semiconductor pattern of the second transistor.

A display device and a method of fabricating the same according to some example embodiments can reduce the number of mask operations, thereby reducing process costs and increasing process efficiency.

However, the characteristics of embodiments according to the present disclosure are not restricted to those set forth herein. The above and other characteristics of the embodiments will become more apparent to one of ordinary skill in the art to which the embodiments pertain by referencing the claims and their equivalents.

BRIEF DESCRIPTION OF THE DRAWINGS

These and/or other aspects will become more apparent and more readily appreciated from the following description of the example embodiments, taken in conjunction with the accompanying drawings in which:

FIG. 1 is a plan view of a display device according to some example embodiments;

FIGS. 24 and 25 are cross-sectional views of display panels according to some example embodiments.

DETAILED DESCRIPTION

Aspects of some example embodiments of the present invention will now be described more fully hereinafter with reference to the accompanying drawings, in which some example embodiments of the invention are shown. This invention may, however, be embodied in different forms and should not be construed as limited to the example embodiments set forth herein. Rather, these example embodiments are provided so that this disclosure will be more thorough and more complete, and will more fully convey the scope of embodiments according to the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In concluding the detailed description, those skilled in the art will appreciate that many variations and modifications can be made to the embodiments without substantially departing from the principles of embodiments according to the present invention. Therefore, the disclosed example embodiments of the invention are used in a generic and descriptive sense only and not for purposes of limitation.

Hereinafter, specific embodiments will be described in more detail with reference to the attached drawings.

Figure 2:
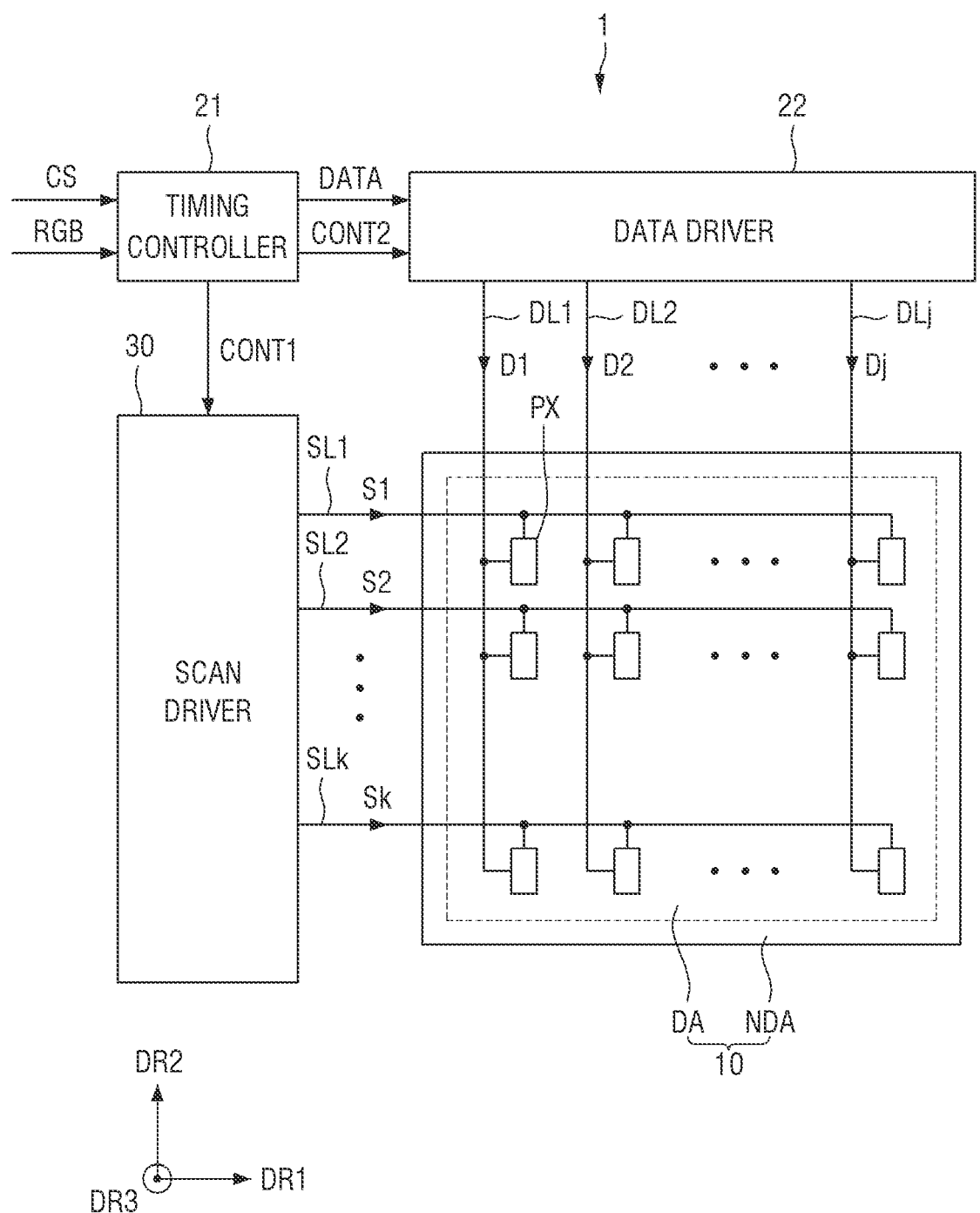
FIG. 2 is a schematic block diagram of the display device according to some example embodiments.

FIG. 1 is a plan view of a display device 1 according to some example embodiments. FIG. 2 is a schematic block diagram of the display device 1 according to some example embodiments.

The display device 1 is a device for displaying moving (e.g., video) images or still (e.g., static) images. The display device 1 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 1 according to some example embodiments may be substantially rectangular in a plan view (e.g., when viewed in a direction perpendicular or normal with respect to the primary plane of the display surface). The display device 1 may be shaped like a rectangle with right-angled corners in a plan view. However, embodiments according to the present disclosure are not limited thereto, and the display device 1 may also be shaped like a rectangle with rounded corners in a plan view.

In the drawings, a first direction DR1 indicates a horizontal direction of the display device 1 in a plan view, and a second direction DR2 indicates a vertical direction of the display device 1 in a plan view. In addition, a third direction DR3 indicates a thickness direction of the display device 1. The first direction DR1 and the second direction DR2 perpendicularly intersect each other, and the third direction DR3 perpendicularly intersects both the first direction DR1 and the second direction DR2 in a direction intersecting a plane in which the first direction DR1 and the second direction DR2 lie. However, directions mentioned with respect to the described example embodiments should be understood as relative directions, and the embodiments are not limited to the mentioned directions.

Unless otherwise defined, the terms "upper," "upper surface" and "upper side" used herein based on the third direction DR3 refer to a display surface side of the display device 1, and the terms "lower," "lower surface" and "lower side" refer to an opposite side of the display device 1 from the display surface side.

The display device 1 according to some example embodiments may include a display panel 10, a timing controller 21, a data driver 22, and a scan driver 30.

The display panel 10 may be an organic light emitting display panel. In the following example embodiments, an embodiment where an organic light emitting display panel is utilized as the display panel 10 will be described as an example. However, embodiments according to the present disclosure are not limited to this embodiment, and other types of display panels such as a liquid crystal display (LCD) panel, a quantum-dot organic light emitting display (QD-OLED) panel, a quantum-dot LCD (QD-LCD) panel, a quantum-nano light emitting display (QNED) panel, and a micro light emitting diode (Micro LED) display panel are also applicable.

The display panel 10 may include a display area DA where a images may be displayed and a non-display area NDA where images are not displayed (e.g., a bezel area, or a region where there are no pixels). The display panel 10 may be divided into the display area DA and the non-display area NDA in a plan view. The non-display area NDA may surround the display area DA. The non-display area NDA may form a bezel.

The display area DA may be shaped like a rectangle with right-angled corners or a rectangle with rounded corners in a plan view. The planar shape of the display area DA is not limited to the rectangle, but may also be a circle, an ellipse, or various other shapes.

The display area DA may include a plurality of pixels PX. The pixels PX may be arranged in a matrix shape. Each of the pixels PX may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation layer. The detailed configuration of each pixel PX will be described in more detail later.

The non-display area NDA may be located adjacent to both short sides and both long sides of the display area DA. In this case, the non-display area NDA may surround all sides of the display area DA and form edges of the display area DA. However, embodiments according to the present disclosure are not limited thereto, and the non-display area NDA may also be located adjacent to only both short sides or both long sides of the display area DA.

In the display area DA, not only the pixels PX, but also a plurality of scan lines SL1 through SLk (where k is an integer of 2 or more), a plurality of data lines DL1 through DLj (where j is an integer of 2 or more) and a plurality of power lines connected to the pixels PX may be arranged. The scan lines SL (SL1 through SLk) may extend in the first direction DR1 and may be arranged along the second direction DR2. The data lines DL (DL1 through DLj) may extend in the second direction DR2 and may be arranged along the first direction DR1.

The display panel 10 includes the pixels PX located at intersections of the scan lines SL1 through SLk (where k is an integer of 2 or more) and the data lines DL1 through DLj (where j is an integer of 2 or more) and arranged in a matrix shape. Each of the pixels PX may be connected to at least any one of the scan lines SL (SL1 through SLk) and any one of the data lines DL (DL1 through DLj).

The timing controller 21 receives digital video data DATA and timing signals from a host system. The timing signals may include a vertical synchronization signal, a horizontal synchronization signal, a data enable signal, and a dot clock. The host system may be an application processor of a smartphone or tablet PC or a system on chip of a monitor or television (TV).

The timing controller 21 generates control signals CS for controlling the operation timing of the data driver 22 and the scan driver 30. The control signals CS may include a source control signal CONT2 for controlling the operating timing of the data driver 22 and a scan control signal CONT1 for controlling the operation timing of the scan driver 30.

The scan driver 30 receives the scan control signal CONT1 from the timing controller 21. The scan driver 30 generates scan signals S1 through Sk (where k is an integer of 2 or more) according to the scan control signal CONT1 and supplies the scan signals S1 through Sk to the scan lines SL1 through SLk of the display panel 10. The scan driver 30 may include a plurality of thin-film transistors and may be formed in the non-display area NDA of the display panel 10. Alternatively, the scan driver 30 may be formed as an integrated circuit. In this case, the scan driver 30 may be mounted on a gate flexible film attached to another side of the display panel 10.

The data driver 22 receives the digital video data DATA and the source control signal CONT2 from the timing controller 21. The data driver 22 converts the digital video data DATA into analog data voltages according to the source control signal CONT2 and supplies the analog data voltages to the data lines DL1 through DLj of the display panel 10. Each of the pixels PX emits light of a luminance level (e.g., a predetermined luminance level) according to a driving current supplied to a light emitting element in response to one of data signals D1 through Dj (where j is an integer of 2 or more) received through the data lines DL1 through DLm.

A power supply circuit may generate voltages necessary for driving the display panel 10 from main power applied from a system board and supply the generated voltages to the display panel 10. For example, the power supply circuit may generate from the main power a first power supply voltage ELVDD (see FIG. 3) and a second power supply voltage ELVSS (see FIG. 3) for driving light emitting elements OLED of the display panel 10 and supply the generated voltages ELVDD and ELVSS to a first power line ELVDL (see FIG. 3) and a second power line ELVSL (see FIG. 3) of the display panel 10. In addition, the power supply circuit may generate driving voltages for driving the timing controller 21, the data driver 22, the scan driver 30, etc. from the main power and supply the generated voltages. The power supply circuit may be formed as an integrated circuit and mounted on a circuit board, but embodiments according to the present disclosure are not limited thereto.

Figure 3:
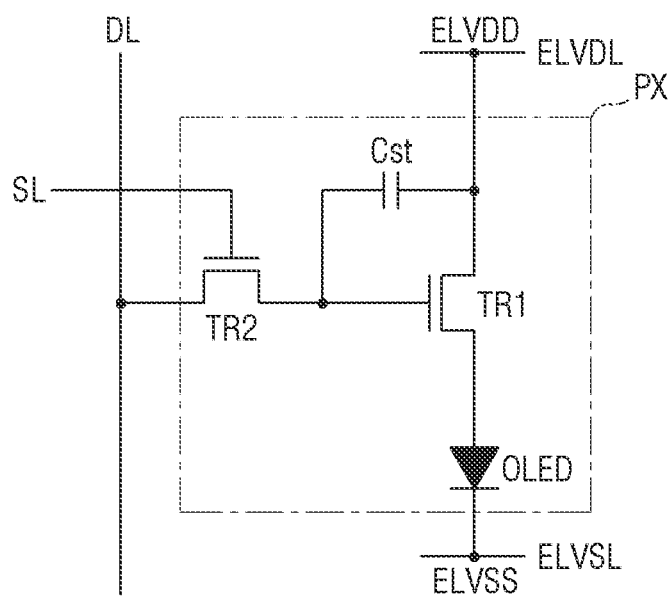
FIG. 3 is an equivalent circuit diagram of one pixel of the display device according to some example embodiments.

FIG. 3 is an equivalent circuit diagram of one pixel PX of the display device 1 according to some example embodiments.

Referring to FIG. 3, the pixel PX may include a first transistor TR1, a second transistor TR2, a light emitting element OLED, and a capacitor Cst. Although each pixel PX has a 2T1C structure including two transistors TR1 and TR2 and one capacitor Cst in FIG. 3, embodiments according to the present disclosure are not limited thereto. Each pixel PX may also include a plurality of pixels and a plurality of capacitors. For example, each pixel PX may also have various modified pixel structures such as a 3T1C structure, a 6T1C structure, and a 7T1C structure.

Each of the first and second transistors TR1 and TR2 may include a first source/drain electrode, a second source/drain electrode, and a gate electrode. One of the first source/drain electrode and the second source/drain electrode may be a source electrode, and the other may be a drain electrode.

Each of the first and second transistors TR1 and TR2 may be formed as a thin-film transistor. In addition, although each of the transistors TR1 and TR2 is described as an N-type metal oxide semiconductor field effect transistor (MOSFET) in FIG. 3, the present disclosure is not limited thereto. Each of the first transistor TR1 and the second transistor TR2 may also be formed as a P-type MOSFET. In this case, positions of the source electrode and the drain electrode of each of the first transistor TR1 and the second transistor TR2 may be changed. An embodiment in which each of the first and second transistors TR1 and TR2 is an N-type MOSFET will be described in more detail below.

The first transistor TR1 may be a driving transistor. For example, the gate electrode of the first transistor TR1 is connected to the second source/drain electrode of the second transistor TR2 and a second electrode of the capacitor Cst. The first source/drain electrode of the first transistor TR1 is connected to the first power line ELVDL. The second source/drain electrode of the first transistor TR1 is connected to an anode of the light emitting element OLED. The first transistor TR1 receives a data signal Dj (where j is an integer of 1 or more) according to a switching operation of the second transistor TR2 and supplies a driving current to the light emitting element OLED.

The gate electrode of the second transistor TR2 is connected to a scan line SL. The first source/drain electrode of the second transistor TR2 is connected to a data line DL. The second source/drain electrode of the second transistor TR2 is connected to the gate electrode of the first transistor TR1 and the second electrode of the capacitor Cst. The second transistor TR2 is turned on by a scan signal Sk (where k is an integer of 1 or more) to perform a switching operation for transmitting the data signal Dj (where j is an integer of 1 or more) to the gate electrode of the first transistor TR1.

A first electrode of the capacitor Cst may be connected to the first power line ELVDL and the first source/drain electrode of the first transistor TR1, and the second electrode of the capacitor Cst may be connected to the gate electrode of the first transistor TR1 and the second source/drain electrode of the second transistor TR2. The capacitor Cst may keep a data voltage applied to the gate electrode of the first transistor TR1 constant.

The light emitting element OLED may emit light according to a driving current of the first transistor TR1. The light emitting element OLED may be an organic light emitting diode including an anode (or a first electrode), an organic light emitting layer, and a cathode (or a second electrode). The anode of the light emitting element OLED may be connected to the second source/drain electrode of the first transistor TR1, and the cathode of the light emitting element OLED may be connected to the second power line ELVSL to which the second power supply voltage ELVSS lower than the first power supply voltage ELVDD is applied.

The planar layout and cross-sectional structure of the above-described pixel PX will now be described in more detail.

Figure 4:
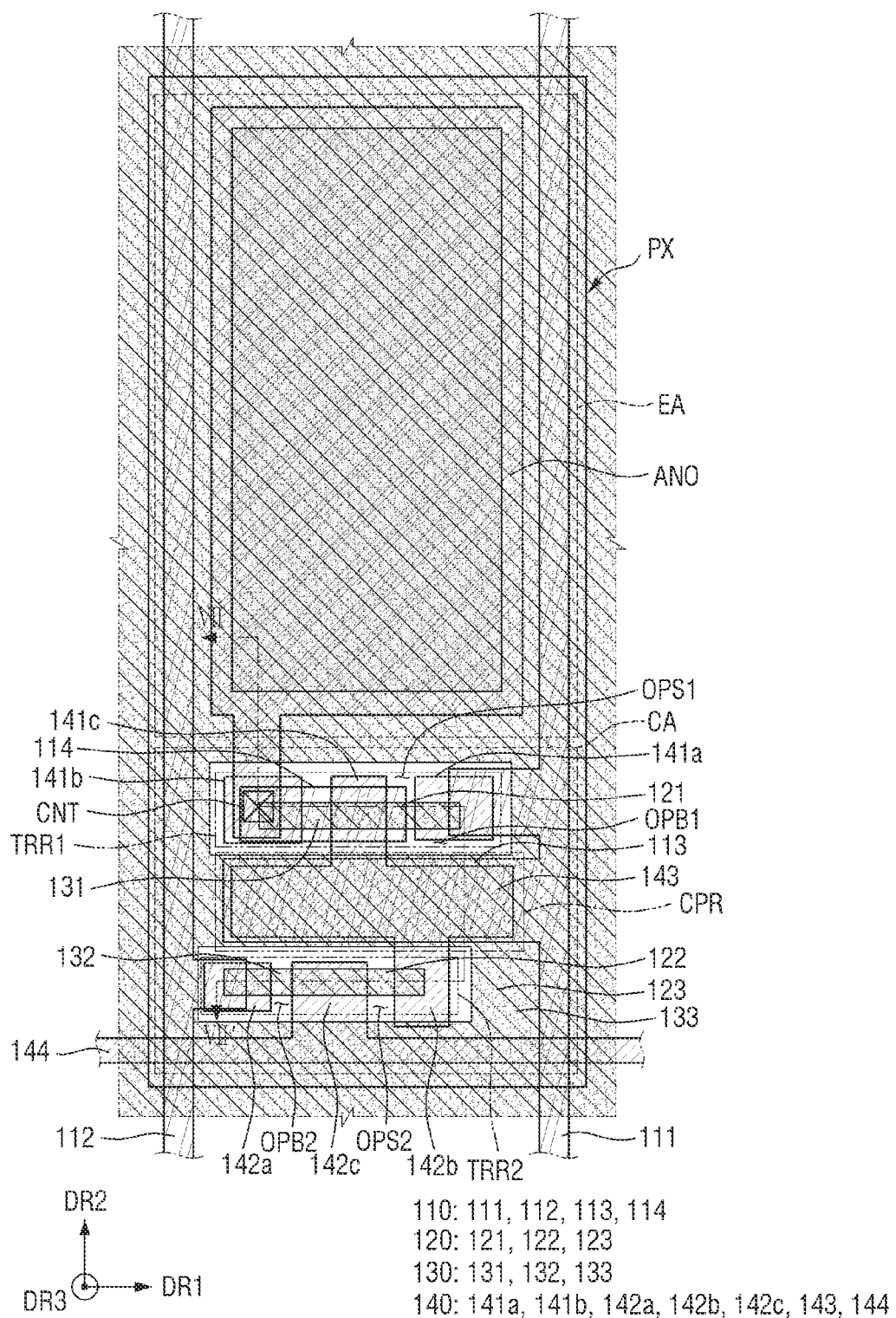
FIG. 4 is a layout view of one pixel of the display device according to some example embodiments.
Figure 5:
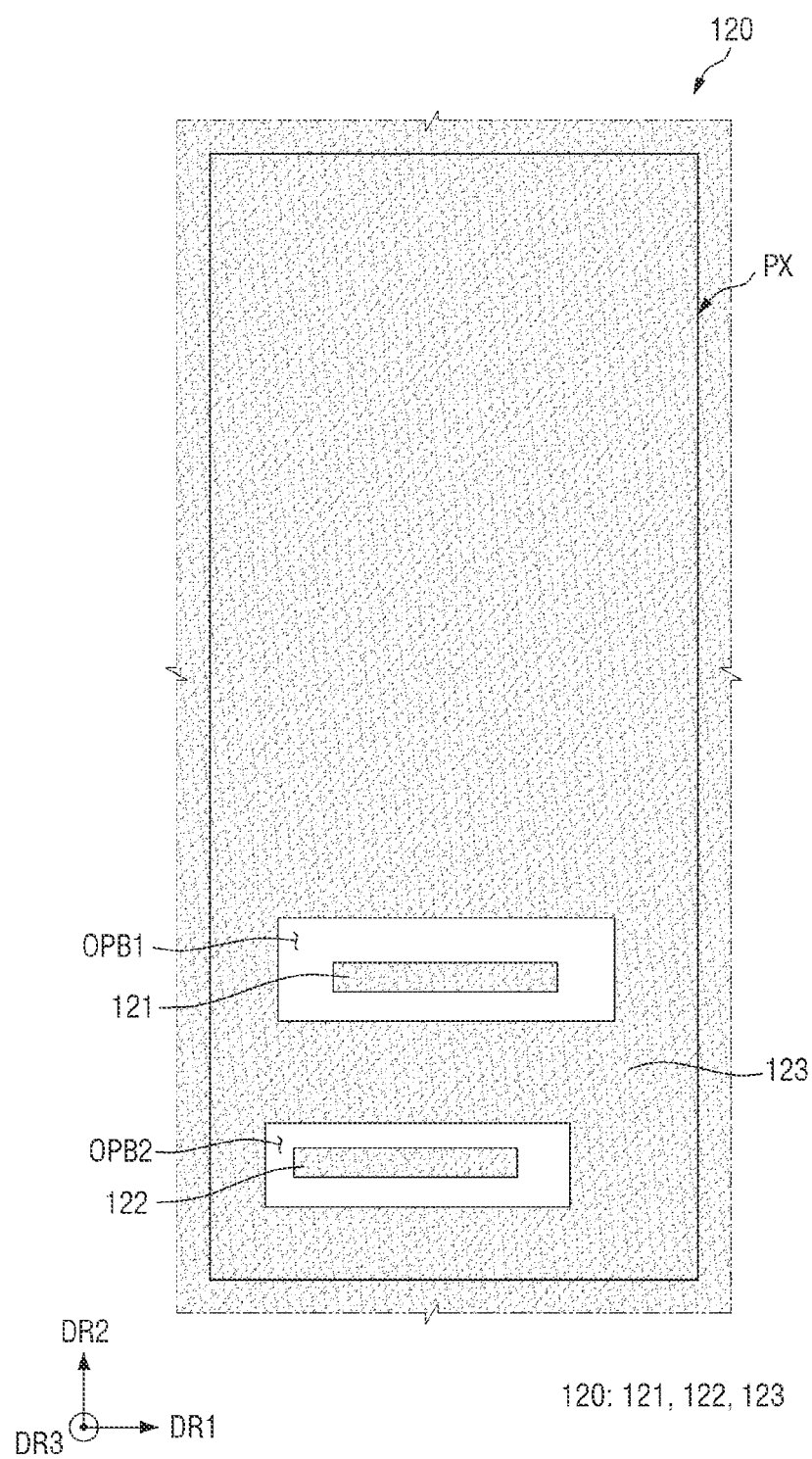
FIG. 5 is a layout view of a buffer layer according to some example embodiments.
Figure 6:
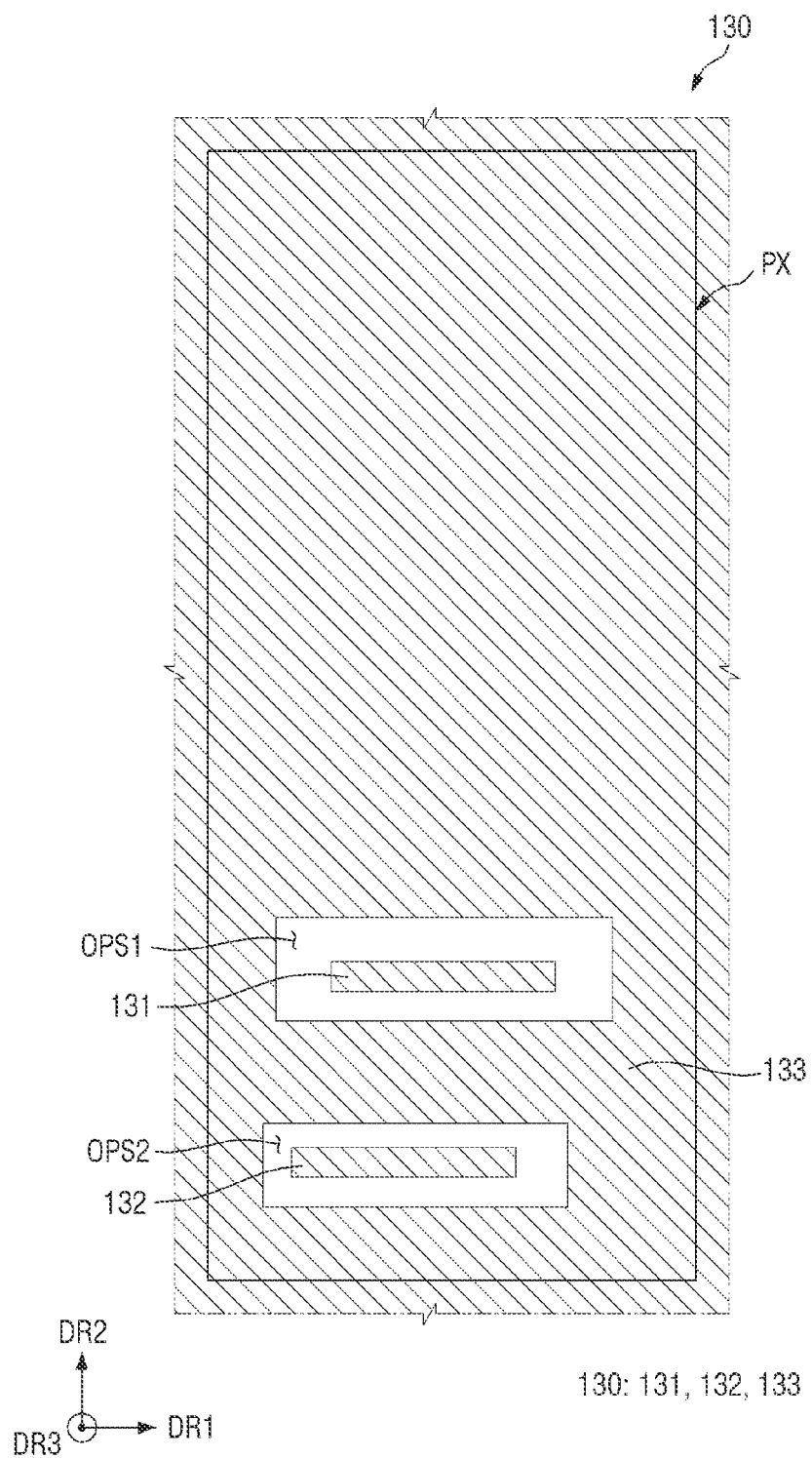
FIG. 6 is a layout view of a semiconductor layer according to some example embodiments.
Figure 7:
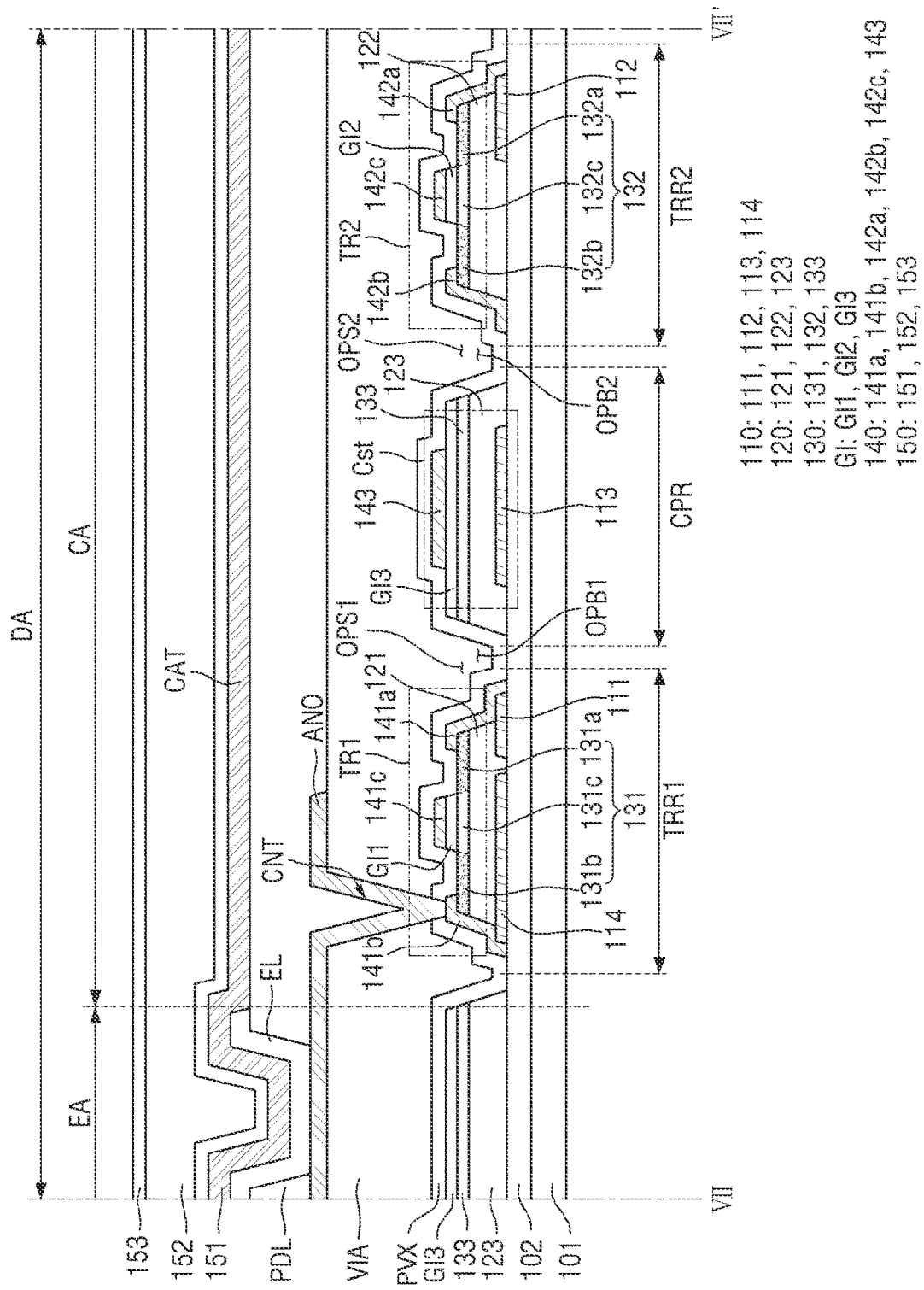
FIG. 7 is a cross-sectional view taken along the line VII-VII' of FIG. 4.

FIG. 4 is a layout view of one pixel PX of the display device 1 according to some example embodiments. FIG. 5 is a layout view of a buffer layer 120 according to some example embodiments. FIG. 6 is a layout view of a semiconductor layer 130 according to some example embodiments. FIG. 7 is a cross-sectional view taken along the line VII-VII' of FIG. 4.

Referring to FIGS. 4 through 7, the pixel PX may include an emission area EA and a circuit area CA. The emission area EA is an area in which the light emitting element OLED is arranged and emits light. The circuit area CA is electrically connected to the data line DL and the scan line SL and includes the first transistor TR1, the second transistor TR2, and the capacitor Cst. Furthermore, the circuit area CA may include a first transistor region TRR1, a second transistor region TRR2, and a capacitor region CPR. The circuit area CA is an area for driving the light emitting element OLED.

Each of the transistors TR1 and TR2 includes a conductive layer forming an electrode, a semiconductor pattern forming a channel, and an insulating layer. The capacitor Cst includes conductive layers forming an electrode and an insulating layer arranged between the conductive layers. For example, the capacitor Cst includes a first electrode 113 (or a capacitor lower electrode) of the capacitor Cst, a second electrode 143 (or a capacitor upper electrode) of the capacitor Cst, and an insulating layer arranged between the first electrode 113 and the second electrode 143. The conductive materials or conductive layers, the semiconductor layers, and the insulating layers described above are arranged on a base substrate 101.

The display panel 10 according to some example embodiments includes the semiconductor layer 130, a plurality of conductive layers and a plurality of insulating layers arranged on the base substrate 101. The conductive layers may include a first conductive layer 110, a second conductive layer 140, and an anode ANO. The insulating layers may include the buffer layer 120, a gate insulating layer GI, a passivation layer PVX, and a via layer VIA. The layers of the display panel 10 may be arranged on the base substrate 101 in the order of a barrier layer 102, the first conductive layer 110, the buffer layer 120, the semiconductor layer 130, the gate insulating layer GI, the second conductive layer 140, the passivation layer PVX, the via layer VIA, the anode ANO, and a pixel defining layer PDL. Each of the above layers may be a single layer or a stack of a plurality of layers. Another layer may also be arranged between the above layers.

The base substrate 101 supports each layer arranged thereon. The base substrate 101 may be made of an insulating material such as polymer resin. The polymer material may be, for example, polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of the same. The base substrate 101 may also include a metal material.

The base substrate 101 may be a flexible substrate that can be bent, folded, rolled, etc. The material that forms the flexible substrate may be, but is not limited to, polyimide (PI).

When an organic light emitting display device is of a bottom emission type or a double-sided emission type, a transparent substrate may be used. When the organic light emitting display device is of a top emission type, not only a transparent substrate but also a translucent or opaque substrate may be applied.

The barrier layer 102 may be arranged on the base substrate 101. The barrier layer 102 may prevent or reduce diffusion of impurity ions, prevent or reduce penetration of moisture or outside air, and perform a surface planarization function. The barrier layer 102 may include silicon nitride, silicon oxide, or silicon oxynitride. The barrier layer 102 can be omitted depending on the type of the base substrate 101 or processing conditions.

The first conductive layer 110 is arranged on the barrier layer 102. However, the present disclosure is not limited thereto. When the barrier layer 102 is omitted, the first conductive layer 110 may be arranged on the base substrate 101. The first conductive layer 110 may be arranged in the display area DA and may include a first power wiring 111 corresponding to the first power line ELVDL (see FIG. 3), a lower light blocking pattern 114, a data wiring 112 corresponding to the data line DL (see FIG. 3), and the first electrode 113 of the capacitor Cst.

The first power wiring 111 may be located on a right side of the pixel PX in plan view. The first power wiring 111 may extend in the second direction DR2. The first power wiring 111 may extend to another pixel PX neighboring the pixel PX in the second direction DR2.

The first power wiring 111 may pass through the first transistor region TRR1. In the drawings, a part of the first power wiring 111 extending in the second direction DR2 protrudes in the first direction DR1, and the protruding part overlaps the first transistor region TRR1. However, the present disclosure is not limited thereto. For example, the first power wiring 111 may also pass through the first transistor region TRR1 without the above protruding part while extending in the second direction DR2.

The first power wiring 111 may pass through at least a part of the first transistor region TRR1 to overlap in the thickness direction and directly contact at least a part of a first source/drain electrode 141a of the first transistor TR1 which will be described later. In other words, the first source/drain electrode 141a of the first transistor TR1 may be formed on the first power wiring 111, and at least a part of an upper surface and/or a side surface of the first power wiring 111 may be covered by the first source/drain electrode 141a of the first transistor TR1.

The data wiring 112 may be located on a left side of the pixel PX in plan view and extend in the second direction DR2. The data wiring 112 may extend to another pixel PX neighboring the pixel PX in the second direction DR2. The data wiring 112 may be located on the left side of the first power wiring 111 and spaced apart from the first power wiring 111.

The data wiring 112 may pass through the second transistor region TRR2. In the drawings, a part of the data wiring 112 extending in the second direction DR2 protrudes in the first direction DR1, and the protruding part overlaps the second transistor region TRR2. However, the present disclosure is not limited thereto. For example, the data wiring 112 may also pass through the second transistor region TRR2 without the above protruding part while extending in the second direction DR2.

The data wiring 112 may pass through at least a part of the second transistor region TRR2 to overlap in the thickness direction and directly contact at least a part of a first source/drain electrode 142a of the second transistor TR2 which will be described later. In other words, the first source/drain electrode 142a of the second transistor TR2 may be formed on the data wiring 112, and at least a part of an upper surface and/or a side surface of the data wiring 112 may be covered by the first source/drain electrode 142a of the second transistor TR2. The first electrode 113 of the capacitor Cst may protrude in the first direction DR1 from the first power wiring 111 and may be generally located in a central part of the circuit area CA. The first electrode 113 of the capacitor Cst may be arranged between the first power wiring 111 and the data wiring 112 in plan view. For example, on the left side of the first power wiring 111 and on the right side of the data wiring 112, the first electrode 113 of the capacitor Cst may be connected to the first power wiring 111 and spaced apart from the data wiring 112. According to some example embodiments, the first electrode 113 of the capacitor Cst may be generally rectangular, but the present disclosure is not limited thereto.

The lower light blocking pattern 114 may be formed in the first transistor region TRR1. The lower light blocking pattern 114 may prevent or reduce light incident from under the display panel 10 from entering a semiconductor pattern 131 of the first transistor TR1 located above the lower light blocking pattern 114, in particular, a channel region 131c of the semiconductor pattern 131. That is, the lower light blocking pattern 114 may cover at least the channel region 131c of the semiconductor pattern 131 of the first transistor TR1 and, by extension, cover the whole of the semiconductor pattern 131 of the first transistor TR1. That is, the lower light blocking pattern 114 may overlap at least the channel region 131c of the semiconductor pattern 131 of the first transistor TR1. In addition, the lower light blocking pattern 114 may be used as another gate electrode of an oxide transistor. In this case, the lower light blocking pattern 114 may be electrically connected to a gate electrode 141c of the first transistor TR1.

The first conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single layer or a multilayer.

The buffer layer 120 is arranged on the first conductive layer 110. The buffer layer 120 may be entirely arranged on the first conductive layer 110 and the barrier layer 102 exposed by the first conductive layer 110 in the display area DA and the non-display area NDA.

The buffer layer 120 may cover the first conductive layer 110 in the display area DA and the non-display area NDA and may be arranged on the entire surface of the barrier layer 102. The buffer layer 120 may serve as an interlayer insulating film that insulates the first conductive layer 110 and the semiconductor layer 130 from each other. As will be described later, the buffer layer 120 may be formed to have the same planar shape as the semiconductor layer 130.

The buffer layer 120 may include a first buffer region 121, a second buffer region 122, and a third buffer region 123. The first buffer region 121 and the second buffer region 122 may be arranged in each pixel PX, and the third buffer region 123 may be arranged over a plurality of pixels PX. The first buffer region 121 and the second buffer region 122 may be arranged in the circuit area CA of each pixel PX, and the third buffer region 123 may be arranged in most of the emission area EA and the circuit area CA of each pixel PX while being arranged over a plurality of pixels PX as described above. For example, the first buffer region 121 may be arranged in the first transistor region TRR1, and the second buffer region 122 may be arranged in the second transistor region TRR2. A part of the third buffer region 123 may be arranged in the capacitor region CPR to fill the remaining area of the pixel PX in which the first buffer region 121 and the second buffer region 122 are not arranged. That is, the third buffer region 123 may occupy most of the area of the buffer layer 120.

The first buffer region 121 and the second buffer region 122 may extend in the first direction DR1 and may be spaced apart from each other. However, the present disclosure is not limited thereto, and the first buffer region 121 and/or the second buffer region 122 may also extend in the second direction DR2. Alternatively, the first buffer region 121 and the second buffer region 122 may be connected to each other and spaced apart from the third buffer region 123.

The buffer layer 120 may further include a first buffer opening OPB1 and a second buffer opening OPB2 defined by the third buffer region 123. The first buffer opening OPB1 and the second buffer opening OPB2 may be arranged in the circuit area CA and spaced apart from each other.

The first buffer region 121 may be arranged in the first buffer opening OPB1, and the second buffer region 122 may be arranged in the second buffer opening OPB2. The first buffer region 121 and the second buffer region 122 may be spaced apart from each other and formed in an island shape in plan view. The first buffer region 121 and the second buffer region 122 may be spaced apart from the third buffer region 123 and surrounded by the third buffer region 123. The first buffer opening OPB1 and the second buffer opening OPB2 may expose at least a part of the underlying barrier layer 102 and/or at least a part of the underlying first conductive layer 110 in an area where the first buffer region 121 and the second buffer region 122 are not arranged.

At least a part of the first conductive layer 110 may be arranged in the first buffer opening OPB1 and the second buffer opening OPB2. In the drawings, only a part of the first power wiring 111 and only a part of the data wiring 112 are arranged in the first buffer opening OPB1 and the second buffer opening OPB2, and the whole of the lower light blocking pattern 114 is arranged in the first buffer opening OPB1. However, the present disclosure is not limited thereto.

The first buffer opening OPB1 may overlap the first transistor region TRR1, and the second buffer opening OPB2 may overlap the second transistor region TRR2. In other words, the first transistor TR1 may be arranged in the first buffer opening OPB1 in plan view. That is, the semiconductor pattern 131, the first source/drain electrode 141a, a second source/drain electrode 141b and the gate electrode 141c of the first transistor TR1 may overlap the first buffer opening OPB1 in the thickness direction (the third direction DR3). In addition, the second transistor TR2 may be arranged in the second buffer opening OPB2 in plan view. That is, a semiconductor pattern 132, the first source/drain electrode 142a, a second source/drain electrode 142b and a gate electrode 142c of the second transistor TR2 may overlap the second buffer opening OPB2 in the thickness direction (the third direction DR3).

The second conductive layer 140, the passivation layer PVX, and/or the via layer VIA may be arranged in a space between the first buffer region 121, the second buffer region 122, and the third buffer region 123. That is, the second conductive layer 140, the passivation layer PVX and/or the via layer VIA may fill a space in which the first buffer region 121 and the second buffer region 122 are not arranged in the first buffer region OPB1 and the second buffer region OPB2.

The buffer layer 120 may include at least one of silicon nitride, silicon oxide, and silicon oxynitride. The buffer layer 120 can be omitted depending on the type of the base substrate 101 or processing conditions.

The semiconductor layer 130 may be arranged on the buffer layer 120. In other words, the semiconductor layer 130 may overlap the buffer layer 120 and have the same planar shape as the buffer layer 120. The semiconductor layer 130 may be arranged on the entire surface of the buffer layer 120 in the display area DA and the non-display area NDA. The semiconductor layer 130 may be arranged in the emission area EA and the circuit area CA of the pixel PX.

For example, the semiconductor layer 130 may include the semiconductor pattern 131 of the first transistor TR1, the semiconductor pattern 132 of the second transistor TR2, and a semiconductor dummy part 133. The semiconductor pattern 131 of the first transistor TR1 may be an active layer of the first transistor TR1, and the semiconductor pattern 132 of the second transistor TR2 may be an active layer of the second transistor TR2. The semiconductor dummy part 133 may be a part of the semiconductor layer 130 excluding the semiconductor pattern 131 of the first transistor TR1 and the semiconductor pattern 132 of the second transistor TR2 and may occupy most of the area of the semiconductor layer 130.

The semiconductor pattern 131 of the first transistor TR1 and the semiconductor pattern 132 of the second transistor TR2 may be arranged in each pixel PX, and the semiconductor dummy part 133 may be arranged over a plurality of pixels PX. The semiconductor pattern 131 of the first transistor TR1 may be arranged in the first transistor region TRR1, and the semiconductor pattern 132 of the second transistor TR2 may be arranged in the second transistor region TRR2. The semiconductor dummy part 133 may be arranged in the capacitor region CPR and arranged in most of the circuit area CA and the emission area EA of the pixel PX.

The semiconductor pattern 131 of the first transistor TR1 and the semiconductor pattern 132 of the second transistor TR2 may extend in the first direction DR1 and may be spaced apart from each other. However, the present disclosure is not limited thereto, and the semiconductor pattern 131 of the first transistor TR1 and/or the semiconductor pattern 132 of the second transistor TR2 may also extend in the second direction DR2. Alternatively, the semiconductor pattern 131 of the first transistor TR1 and the semiconductor pattern 132 of the second transistor TR2 may be connected to each other and spaced apart from the semiconductor dummy part 133.

The semiconductor pattern 131 of the first transistor TR1, the semiconductor pattern 132 of the second transistor TR2 and the semiconductor dummy part 133 of the semiconductor layer 130 may have substantially the same planar shapes as the first buffer region 121, the second buffer region 122 and the third buffer region 123 of the buffer layer 120, respectively.

For example, the planar shape of the semiconductor pattern 131 of the first transistor TR1 may be substantially the same as the planar shape of the first buffer region 121 of the buffer layer 120. A length of the semiconductor pattern 131 of the first transistor TR1 extending in the first direction DR1 may be equal to or smaller than a length of the first buffer region 121 extending in the first direction DR1. In addition, a width of the semiconductor pattern 131 of the first transistor TR1 in the second direction DR2 may be equal to or smaller than a width of the first buffer region 121 in the second direction DR2. In this case, the semiconductor pattern 131 of the first transistor TR1 and the first buffer region 121 may completely overlap each other so that side surfaces of the semiconductor pattern 131 of the first transistor TR1 are aligned with side surfaces of the first buffer region 121 or that the whole of the semiconductor pattern 131 of the first transistor TR1 overlaps at least a part of the first buffer region 121.

The planar shape of the semiconductor pattern 132 of the second transistor TR2 may be substantially the same as the planar shape of the second buffer region 122 of the buffer layer 120. A length of the semiconductor pattern 132 of the second transistor TR2 extending in the first direction DR1 may be equal to or smaller than a length of the second buffer region 122 extending in the first direction DR1. In addition, a width of the semiconductor pattern 132 of the second transistor TR2 in the second direction DR2 may be equal to or smaller than a width of the second buffer region 122 in the second direction DR2. In this case, the semiconductor pattern 132 of the second transistor TR2 and the second buffer region 122 may completely overlap each other so that side surfaces of the semiconductor pattern 132 of the second transistor TR2 are aligned with side surfaces of the second buffer region 122 or that the whole of the semiconductor pattern 132 of the second transistor TR2 overlaps at least a part of the second buffer region 122.

The planar shape of the semiconductor dummy part 133 may be substantially the same as the planar shape of the third buffer region 123 of the buffer layer 120. The semiconductor dummy part 133 may completely overlap the third buffer region 123 of the buffer layer 120, and side surfaces of the semiconductor dummy part 133 may be aligned with side surfaces of the third buffer region 123 of the buffer layer 120. However, the present disclosure is not limited thereto, and the whole of the semiconductor dummy part 133 may also overlap a part of the third buffer region 123.

The semiconductor layer 130 may further include a first semiconductor opening OPS1 and a second semiconductor opening OPS2 defined by the semiconductor dummy part 133. The first semiconductor opening OPS1 and the second semiconductor opening OPS2 of the semiconductor layer 130 may be formed to have substantially the same shape as the first buffer opening OPB1 and the second buffer opening OPB2 of the buffer layer 120, respectively. In other words, the planar shape of the first semiconductor opening OPS1 may be substantially the same as the planar shape of the first buffer opening OPB1, and the first semiconductor opening OPS1 may overlap the first buffer opening OPB1. The planar shape of the second semiconductor opening OPS2 may be substantially the same as the planar shape of the second buffer opening OPB2, and the second semiconductor opening OPS2 may overlap the second buffer opening OPB2.

The semiconductor pattern 131 of the first transistor TR1 may be arranged in the first semiconductor opening OPS1, and the semiconductor pattern 132 of the second transistor TR2 may be arranged in the second semiconductor opening OPS2. That is, the semiconductor pattern 131 of the first transistor TR1 and the semiconductor pattern 132 of the second transistor TR2 may be spaced apart from each other and formed in an island shape in plan view. In addition, the semiconductor pattern 131 of the first transistor TR1 and the semiconductor pattern 132 of the second transistor TR2 may be spaced apart from the semiconductor dummy part 133 and surrounded by the semiconductor dummy part 133.

The second conductive layer 140, the passivation layer PVX, and/or the via layer VIA may be arranged in a space between the semiconductor pattern 131 of the first transistor TR1, the semiconductor pattern 132 of the second transistor TR2, and the semiconductor dummy part 133. That is, the second conductive layer 140, the passivation layer PVX and/or the via layer VIA may fill a space in which the semiconductor pattern 131 of the first transistor TR1 and the semiconductor pattern 132 of the second transistor TR2 are not arranged in the first semiconductor opening OPS1 and the second semiconductor opening OPS2.

The first semiconductor opening OPS1 may overlap the first transistor region TRR1, and the second semiconductor opening OPS2 may overlap the second transistor region TRR2.

The semiconductor pattern 131 of the first transistor TR1 may include the channel region 131c of the first transistor TR1 which is overlapped by the overlying gate electrode 141c of the first transistor TR1 in the thickness direction and a first source/drain region 131a of the first transistor TR1 and a second source/drain region 131b of the first transistor TR1 which are located on a side and the other side of the channel region 131c, respectively. The first and second source/drain regions 131a and 131b of the first transistor TR1 may be conducting regions and may have higher conductivity and lower electrical resistance than the channel region 131c of the first transistor TR1.

The semiconductor pattern 132 of the second transistor TR2 may include a channel region 132c of the second transistor TR2 which is overlapped by the overlying gate electrode 142c of the second transistor TR2 in the thickness direction and a first source/drain region 132a of the second transistor TR2 and a second source/drain region 132b of the second transistor TR2 which are located on a side and the other side of the channel region 132c, respectively. The first and second source/drain regions 132a and 132b of the second transistor TR2 may be conducting regions and may have higher conductivity and lower electrical resistance than the channel region 132c of the second transistor TR2.

The semiconductor layer 130 may include an oxide semiconductor. Examples of the oxide semiconductor may include a binary compound (ABx), a ternary compound (ABxCy) and a quaternary compound (ABxCyDz) containing indium (In), zinc (Zn), gallium (Ga), tin (Sn), titanium (Ti), aluminum (Al), hafnium (Hf), zirconium (Zr), magnesium (Mg), etc. According to some example embodiments, the semiconductor layer 130 may include indium tin zinc oxide (IGZO).

The gate insulating layer GI is arranged on the semiconductor layer 130. The gate insulating layer GI may be arranged on only a part of the semiconductor layer 130. That is, the gate insulating layer GI may overlap a part of the semiconductor layer 130. The gate insulating layer GI may cover the channel regions 131c and 132c of the semiconductor layer 130 and expose the first and second source/drain regions 131a, 131b, 132a and 132b and side surfaces of the semiconductor layer 130.

The gate insulating layer GI may include a first gate insulating layer region GI1, a second gate insulating layer region GI2, and a third gate insulating layer region GI3. The first gate insulating layer region GI1 may be arranged in the first transistor region TRR1, and the second gate insulating layer region GI2 may be located in the second transistor region TRR2. The third gate insulating layer region GI3 may be located in the capacitor region CPR and located in most of the non-display area NDA and the circuit area CA and the emission area EA of the display area DA. The third gate insulating layer region GI3 may occupy most of the area of the gate insulating layer GI. However, the present disclosure is not limited thereto, and the third gate insulating layer region GI3 can be removed depending on the process.

The first gate insulating layer region GI1 may have substantially the same planar shape as the gate electrode 141c of the first transistor TR1 located on the first gate insulating layer region GI1, and the second gate insulating layer region GI2 may have substantially the same planar shape as the gate electrode 142c of the second transistor TR2 located on the second gate insulating layer region GI2. The third gate insulating layer region GI3 may have substantially the same planar shape as the semiconductor dummy part 133 of the semiconductor layer 130 and the third buffer region 123 of the buffer layer 120 located under the third gate insulating layer region GI3. Side surfaces of the third gate insulating layer region GI3 may be aligned with the side surfaces of the semiconductor dummy part 133 and the side surfaces of the third buffer region 123.

The gate insulating layer GI may include a silicon compound, a metal oxide, or the like. For example, the gate insulating layer GI may include silicon oxide, silicon nitride, silicon oxynitride, aluminum oxide, tantalum oxide, hafnium oxide, zirconium oxide, titanium oxide, etc. These materials may be used alone or in combination with each other.

The second conductive layer 140 is located on the gate insulating layer GI. The second conductive layer 140 may include the first source/drain electrode 141a, the second source/drain electrode 141b and the gate electrode 141c of the first transistor TR1, the first source/drain electrode 142a, the second source/drain electrode 142b and the gate electrode 142c of the second transistor TR2, the second electrode 143 (or the upper electrode) of the capacitor Cst, and a scan wiring 144 corresponding to the scan line SL (see FIG. 3).

The first source/drain electrode 141a, the second source/drain electrode 141b and the gate electrode 141c of the first transistor TR1 may be located in the first transistor region TRR1, and the first source/drain electrode 142a, the second source/drain electrode 142b and the gate electrode 142c of the second transistor TR2 may be located in the second transistor region TRR2, and the second electrode 143 of the capacitor Cst may be located in the capacitor region CPR.

The first source/drain electrode 141a, the second source/drain electrode 141b and the gate electrode 141c of the first transistor TR1 may overlap the first semiconductor opening OPS1 and the first buffer opening OPB1, or at least a part of each of the first source/drain electrode 141a, the second source/drain electrode 141b and the gate electrode 141c of the first transistor TR1 may be located in the first semiconductor opening OPS1 and the first buffer opening OPB1. Furthermore, the first source/drain electrode 141a and the second source/drain electrode 141b of the first transistor TR1 may cover an upper surface and/or the side surfaces of the semiconductor pattern 131 of the first transistor TR1 while covering an upper surface and/or side surfaces of a part (e.g., the first power wiring 111 and the lower light blocking pattern 114) of the first conductive layer 110.

For example, the first source/drain electrode 141a of the first transistor TR1 may directly contact at least a part of an upper surface and/or a side surface of the first source/drain region 131a of the semiconductor pattern 131 of the first transistor TR1 and cover at least a part of the upper surface and/or the side surface of the first source/drain region 131a of the semiconductor pattern 131 of the first transistor TR1. The first source/drain electrode 141a of the first transistor TR1 may directly contact a side surface of the first buffer region 121 of the buffer layer 120 and cover the side surface of the first buffer region 121. The first source/drain electrode 141a of the first transistor TR1 may directly contact a part of the first conductive layer 110, that is, at least a part of the upper surface and/or a side surface of the first power wiring 111 and cover at least a part of the upper surface and/or the side surface of the first power wiring 111. In addition, the first source/drain electrode 141a of the first transistor TR1 may contact an upper surface of the barrier layer 102, although the present disclosure is not limited thereto.

That is, the first source/drain electrode 141a of the first transistor TR1 may extend along a side surface of the semiconductor pattern 131 of the first transistor TR1 and a side surface of the first buffer region 121, directly contact the first source/drain region 131a of the first transistor TR1 and the first power wiring 111 without through contact holes, and electrically connect the first source/drain region 131a of the first transistor TR1 to the first power wiring 111.

The second source/drain electrode 141b of the first transistor TR1 may overlap at least a part of the semiconductor pattern 131 of the first transistor TR1, in particular, at least a part of the second source/drain region 131b of the first transistor TR1 and/or at least a part of the first conductive layer 110, in particular, at least a part of the lower light blocking pattern 114.

For example, the second source/drain electrode 141b of the first transistor TR1 may directly contact at least a part of an upper surface and/or a side surface of the second source/drain region 131b of the semiconductor pattern 131 of the first transistor TR1 and cover at least a part of the upper surface and/or the side surface of the second source/drain region 131b of the semiconductor pattern 131 of the first transistor TR1. The second source/drain electrode 141b of the first transistor TR1 may directly contact a side surface of the first buffer region 121 of the buffer layer 120 and cover the side surface of the first buffer region 121. The second source/drain electrode 141b of the first transistor TR1 may directly contact a part of the first conductive layer 110, that is, at least a part of an upper surface and/or a side surface of the lower light blocking pattern 114 and cover at least a part of the upper surface and/or the side surface of the lower light blocking pattern 114. In addition, the second source/drain electrode 141b of the first transistor TR1 may contact the upper surface of the barrier layer 102, although the present disclosure is not limited thereto.

That is, the second source/drain electrode 141b of the first transistor TR1 may extend along a side surface of the semiconductor pattern 131 of the first transistor TR1 and a side surface of the first buffer region 121, directly contact the second source/drain region 131b of the first transistor TR1 and the lower light blocking pattern 114 without through contact holes, and electrically connect the second source/drain region 131b of the first transistor TR1 to the lower light blocking pattern 114.

The gate electrode 141c of the first transistor TR1 may protrude from an upper side of the second electrode 143 of the capacitor Cst. The gate electrode 141c of the first transistor TR1 may branch upward in the second direction DR2 from the second electrode 143 of the capacitor Cst to overlap the channel region 131c of the semiconductor pattern 131 of the first transistor TR1.

The first source/drain electrode 142a, the second source/drain electrode 142b and the gate electrode 142c of the second transistor TR2 may overlap the second semiconductor opening OPS2 and the second buffer opening OPB2, or at least a part of each of the first source/drain electrode 142a, the second source/drain electrode 142b and the gate electrode 142c of the second transistor TR2 may be located in the second semiconductor opening OPS2 and the second buffer opening OPB2. Furthermore, the first source/drain electrode 142a and the second source/drain electrode 142b of the second transistor TR2 may cover an upper surface and/or the side surfaces of the semiconductor pattern 132 of the second transistor TR2 while covering an upper surface and/or side surfaces of a part (e.g., the data wiring 112) of the first conductive layer 110.

The first source/drain electrode 142a of the second transistor TR2 may overlap at least a part of the semiconductor pattern 132 of the second transistor TR2, in particular, at least a part of the first source/drain region 132a of the second transistor TR2 and/or at least a part of the first conductive layer 110, in particular, at least a part of the data wiring 112.

For example, the first source/drain electrode 142a of the second transistor TR2 may directly contact at least a part of an upper surface and/or a side surface of the first source/drain region 132a of the semiconductor pattern 132 of the second transistor TR2 and cover at least a part of the upper surface and/or the side surface of the first source/drain region 132a of the semiconductor pattern 132 of the second transistor TR2. The first source/drain electrode 142a of the second transistor TR2 may directly contact a side surface of the second buffer region 122 of the buffer layer 120 and cover the side surface of the second buffer region 122. The first source/drain electrode 142a of the second transistor TR2 may directly contact a part of the first conductive layer 110, that is, at least a part of the upper surface and/or a side surface of the data wiring 112 and cover at least a part of the upper surface and/or the side surface of the data wiring 112. In addition, the first source/drain electrode 142a of the second transistor TR2 may contact the upper surface of the barrier layer 102, although the present disclosure is not limited thereto.

That is, the first source/drain electrode 142a of the second transistor TR2 may extend along a side surface of the semiconductor pattern 132 of the second transistor TR2 and a side surface of the second buffer region 122, directly contact the first source/drain region 132a of the second transistor TR2 and the data wiring 112 without through contact holes, and electrically connect the first source/drain region 132a of the second transistor TR2 to the data wiring 112.

The second source/drain electrode 142b of the second transistor TR2 may directly contact at least a part of an upper surface and/or a side surface of the second source/drain region 132b of the semiconductor pattern 132 of the second transistor TR2 and cover at least a part of the upper surface and/or the side surface of the second source/drain region 132b of the semiconductor pattern 132 of the second transistor TR2. The second source/drain electrode 142b of the second transistor TR2 may directly contact a side surface of the second buffer region 122 of the buffer layer 120 and cover the side surface of the second buffer region 122. In addition, the second source/drain electrode 142b of the second transistor TR2 may contact the upper surface of the barrier layer 102, although the present disclosure is not limited thereto.

The gate electrode 142c of the second transistor TR2 may protrude from the scan wiring 144. The gate electrode 142c of the second transistor TR2 may branch upward in the second direction DR2 from the scan wiring 144 to overlap the channel region 132c of the semiconductor pattern 132 of the second transistor TR2.

The second electrode 143 of the capacitor Cst may be located on the first electrode 113 of the capacitor Cst to overlap at least a part of the first electrode 113 of the capacitor Cst. The shape of the second electrode 143 of the capacitor Cst may be generally similar to the shape of the first electrode 113 of the capacitor Cst. The second electrode 143 of the capacitor Cst may be smaller in area than the first electrode 113 of the capacitor Cst to expose a part of the first electrode 113 of the capacitor Cst.

The second electrode 143 of the capacitor Cst may overlap the first electrode 113 of the capacitor Cst with the third buffer region 123 of the buffer layer 120, the semiconductor dummy part 133 of the semiconductor layer 130, and the third gate insulating layer region GI3 of the gate insulating layer GI interposed between them, thereby forming the capacitor Cst. The third buffer region 123 of the buffer layer 120, the semiconductor dummy part 133 of the semiconductor layer 130 and the third gate insluting layer region GI3 of the gate insulating layer GI interposed between the first electrode 113 of the capacitor Cst and the second electrode 143 of the capacitor Cst may be a dielectric of the capacitor Cst. However, the third gate insulating layer region GI3 of the gate insulating layer GI can be removed depending on the process.

The second electrode 143 of the capacitor Cst may be located in the entire capacitor region CPR. The second electrode 143 of the capacitor Cst may be located in the entire capacitor region CPR and may partially extend to be connected to the gate electrode 141c of the first transistor TR1 and the second source/drain electrode 142b of the second transistor TR2. For example, the second electrode 143 of the capacitor Cst may be located in the capacitor region CPR and may be physically and/or electrically connected to the gate electrode 141c of the first transistor TR1 located in the first transistor region TRR1 and the second source/drain electrode 142b of the second transistor TR2 located in the second transistor region TRR2.

The second electrode 143 of the capacitor Cst, the gate electrode 141c of the first transistor TR1, and the second source/drain electrode 142b of the second transistor TR2 may be integrated into one second conductive layer pattern.

The scan wiring 144 may be located on a lower side of the pixel PX (or a lower side of the circuit area CA) in plan view. The scan wiring 144 may extend in the first direction DR1. The scan wiring 144 may extend to another pixel PX neighboring the pixel PX in the first direction DR1. The scan wiring 144 may be located on a different layer from the first power wiring 111 and the data wiring 112 and may be located above the first power wiring 111 and the data wiring 112. The scan wiring 144 extending in the first direction DR1 may intersect the first power wiring 111 and the data wiring 112 extending in the second direction DR2. However, at an intersection of the scan wiring 144 and each of the first power wiring 111 and the data wiring 112, one or more insulating layers may be located between the scan wiring 144 and each of the first power wiring 111 and the data wiring 112 to insulate the scan wiring 144 from each of the first power wiring 111 and the data wiring 112. The scan wiring 144 may be located under the second electrode 143 of the capacitor Cst and spaced apart from the second electrode 143 of the capacitor Cst.

The second conductive layer 140 may be made of a material with low resistivity. The second conductive layer 140 may include, but is not limited to, one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The passivation layer PVX is located on the second conductive layer 140. The passivation layer PVX covers the second conductive layer 140 to protect the second conductive layer 140. The passivation layer PVX may be formed not only on the second conductive layer 140 but also in the first semiconductor opening OPS1, the second semiconductor opening OPS2, the first buffer opening OPB1, and the second buffer opening OPB2.

For example, the passivation layer PVX may cover not only upper and side surfaces of the second conductive layer 140 but also an upper surface and/or side surfaces of the gate insulating layer GI, an upper surface and/or the side surfaces of the semiconductor layer 130, an upper surface and/or side surfaces of the buffer layer 120, an upper surface and/or side surfaces of the first conductive layer 110, and the upper surface of the barrier layer 102.

The passivation layer PVX may include an inorganic insulating material such as silicon oxide, silicon nitride, silicon oxynitride, hafnium oxide, aluminum oxide, titanium oxide, tantalum oxide, or zinc oxide. According to some example embodiments, the passivation layer PVX may be formed in the display area DA and may not be formed in at least a part of the non-display area NDA.

The via layer VIA is located on the passivation layer PVX. The via layer VIA may be located on the passivation layer PVX to completely cover an upper surface of the passivation layer PVX. The via layer VIA may also be located in the first semiconductor opening OPS1, the second semiconductor opening OPS2, the first buffer opening OPB1, and the second buffer opening OPB2. When the via layer VIA is made of an organic layer, its upper surface may be flat despite a step under the via layer VIA.

The via layer VIA may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The via layer VIA may further include a photosensitive material, but the present disclosure is not limited thereto.

The anode ANO is located on the via layer VIA. The anode ANO may be located separately in each pixel. The anode ANO may be electrically connected to the second source/drain region 141b of the first transistor TR1 through a contact hole CNT that penetrates the via layer VIA and exposes a part of the second source/drain region 141b of the first transistor TR1. The anode ANO may be located in the display area DA and may not be located in the non-display area NDA.

The anode ANO may have, but is not limited to, a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same are stacked. The material layer having a high work function may be located on the reflective material layer to be close to a light emitting layer EL. The anode ANO may have, but is not limited to, a multilayer structure of ITO/Mg, ITO/MgF, ITO/Ag, or ITO/Ag/ITO.

The pixel defining layer PDL may be located on the anode ANO. The pixel defining layer PDL may include an opening that partially exposes the anode ANO. The pixel defining layer PDL may be made of an organic insulating material or an inorganic insulating material. For example, the pixel defining layer PDL may include at least one of polyimide resin, acrylic resin, a silicone compound, and polyacrylic resin.

The light emitting layer EL, a cathode CAT, and a thin-film encapsulation layer 150 may be further arranged on the anode ANO exposed by the pixel defining layer PDL.

The light emitting layer EL may include an organic material layer. The organic material layer of the light emitting layer EL may include an organic light emitting layer and may further include a hole injection/transport layer and/or an electron injection/transport layer.

The cathode CAT maybe located on the light emitting layer EL. The cathode CAT may be a common electrode located entirely without distinction between the pixels PX. The anode ANO, the light emitting layer EL and the cathode CAT may constitute the organic light emitting element OLED.

The cathode CAT may include a material layer having a small work function, such as Li, Ca, LiF/Ca, LiF/Al, Al, Mg, Ag, Pt, Pd, Ni, Au Nd, Ir, Cr, BaF, Ba, or a compound or mixture of the same (e.g., a mixture of Ag and Mg). The cathode CAT may further include a transparent metal oxide layer located on the material layer having a small work function.

The thin-film encapsulation layer 150 is located on the cathode CAT. The thin-film encapsulation layer 150 may include a first inorganic layer 151, a first organic layer 152, and a second inorganic layer 153. According to some example embodiments, the first inorganic layer 151 and the second inorganic layer 153 may contact each other at an end of the thin-film encapsulation layer 150. The first organic layer 152 may be sealed by the first inorganic layer 151 and the second inorganic layer 153.

Each of the first inorganic layer 151 and the second inorganic layer 153 may include silicon nitride, silicon oxide, or silicon oxynitride. The first organic layer 152 may include an organic insulating material.

A method of fabricating the above-described display device 1 will now be described with reference to FIGS. 8 through 18.

Figure 8:
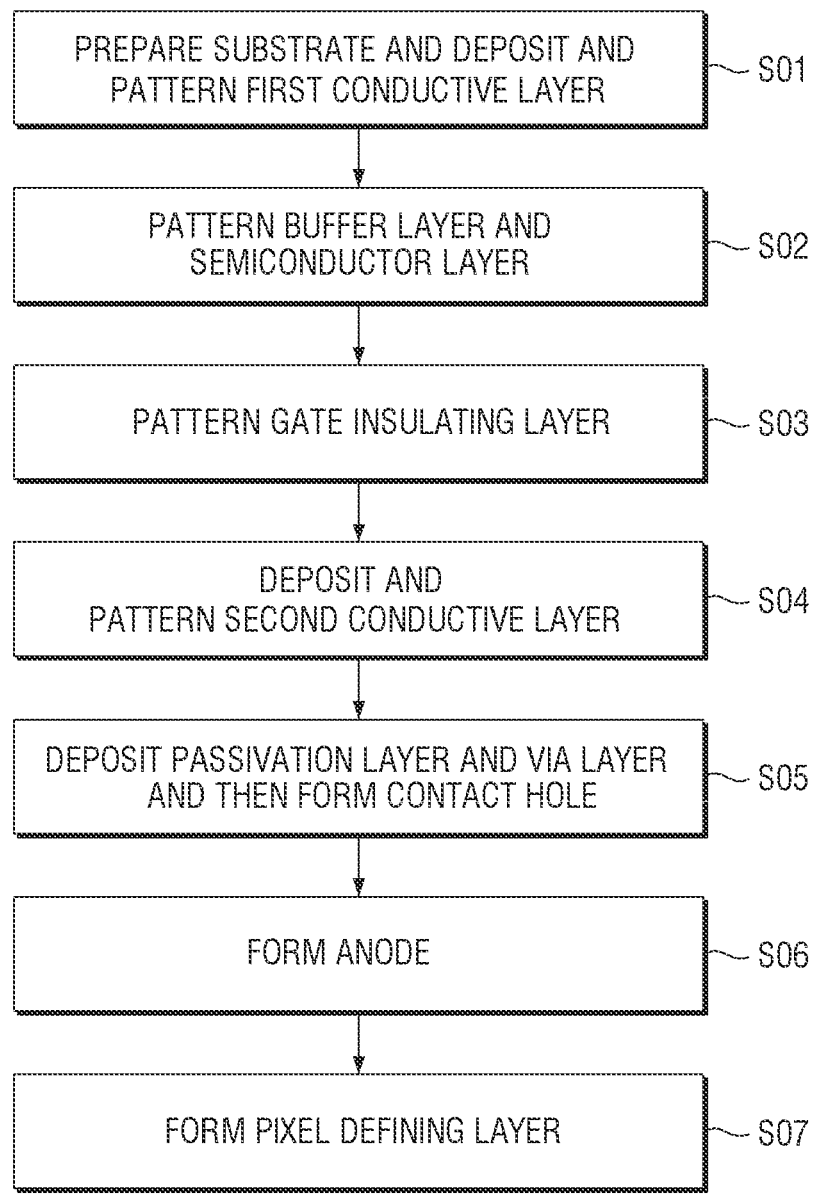
FIG. 8 is a flowchart illustrating a method of fabricating a display device according to some example embodiments.

FIG. 8 is a flowchart illustrating a method of fabricating a display device according to some example embodiments. FIGS. 9 through 18 are cross-sectional views illustrating operations in the method of fabricating a display device of FIG. 7

Figure 9:
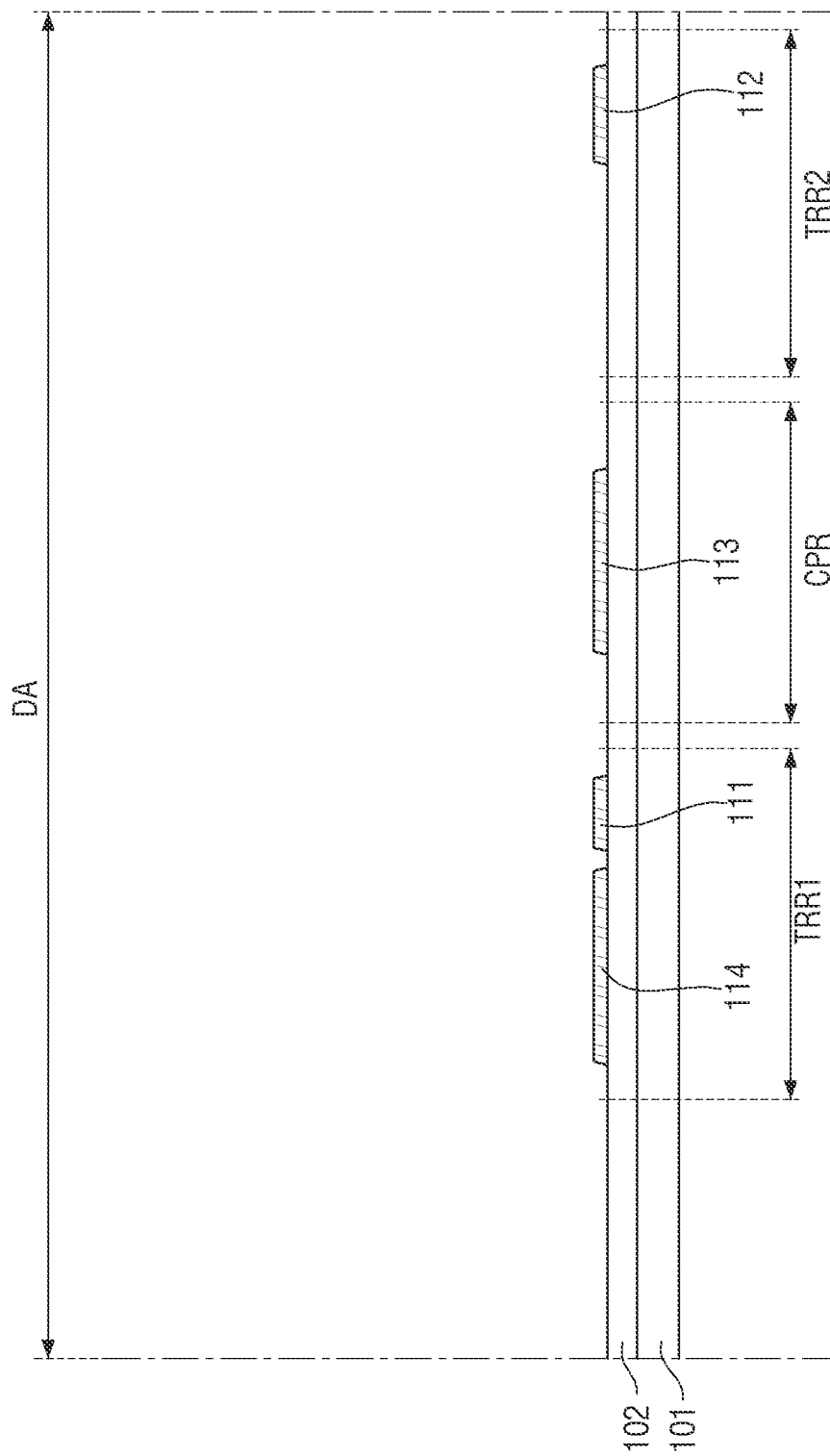
FIGS. 9 through 18 are cross-sectional views illustrating operations in the method of fabricating a display device according to some example embodiments.
Figure 10:
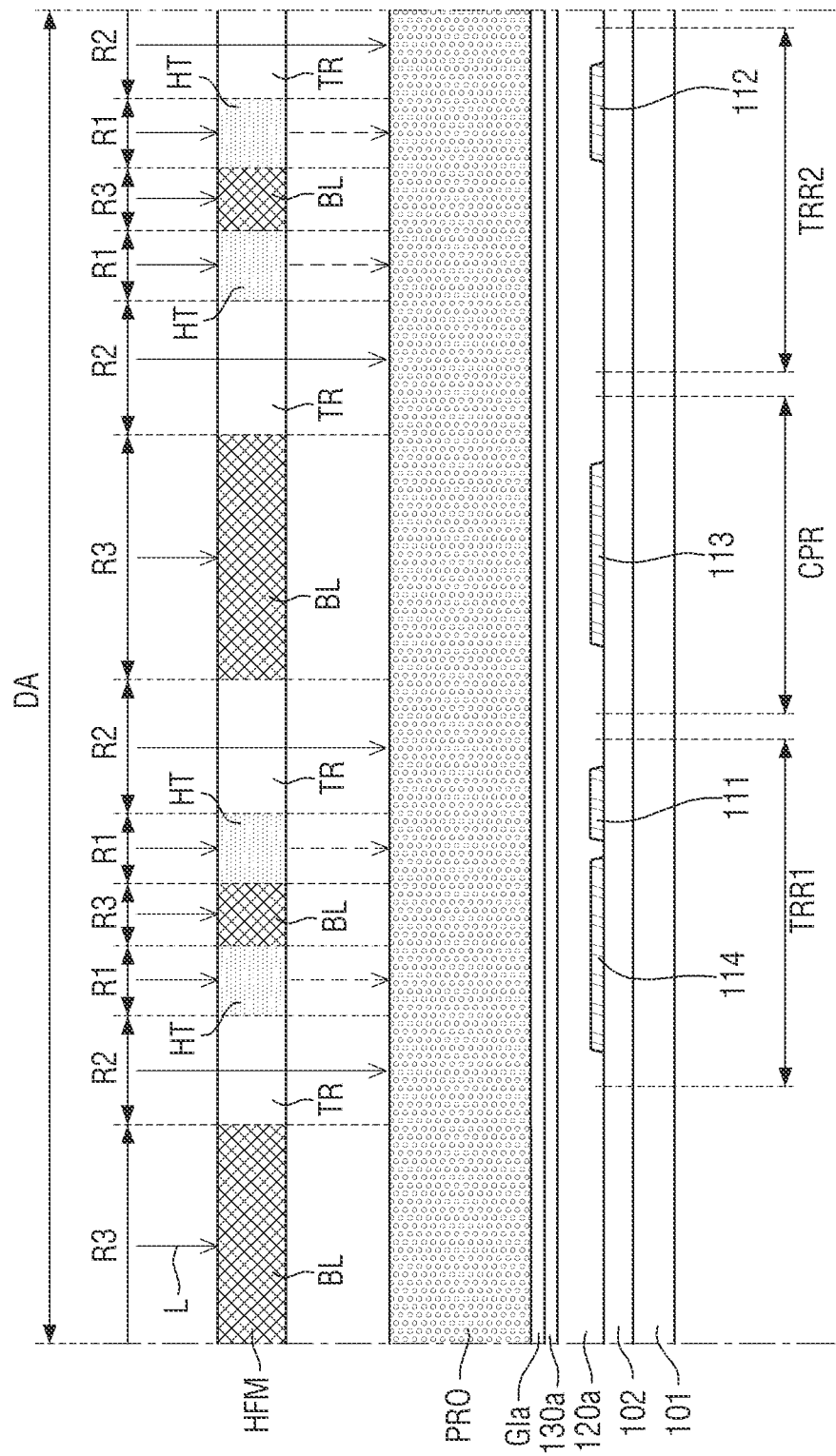
Figure 11:
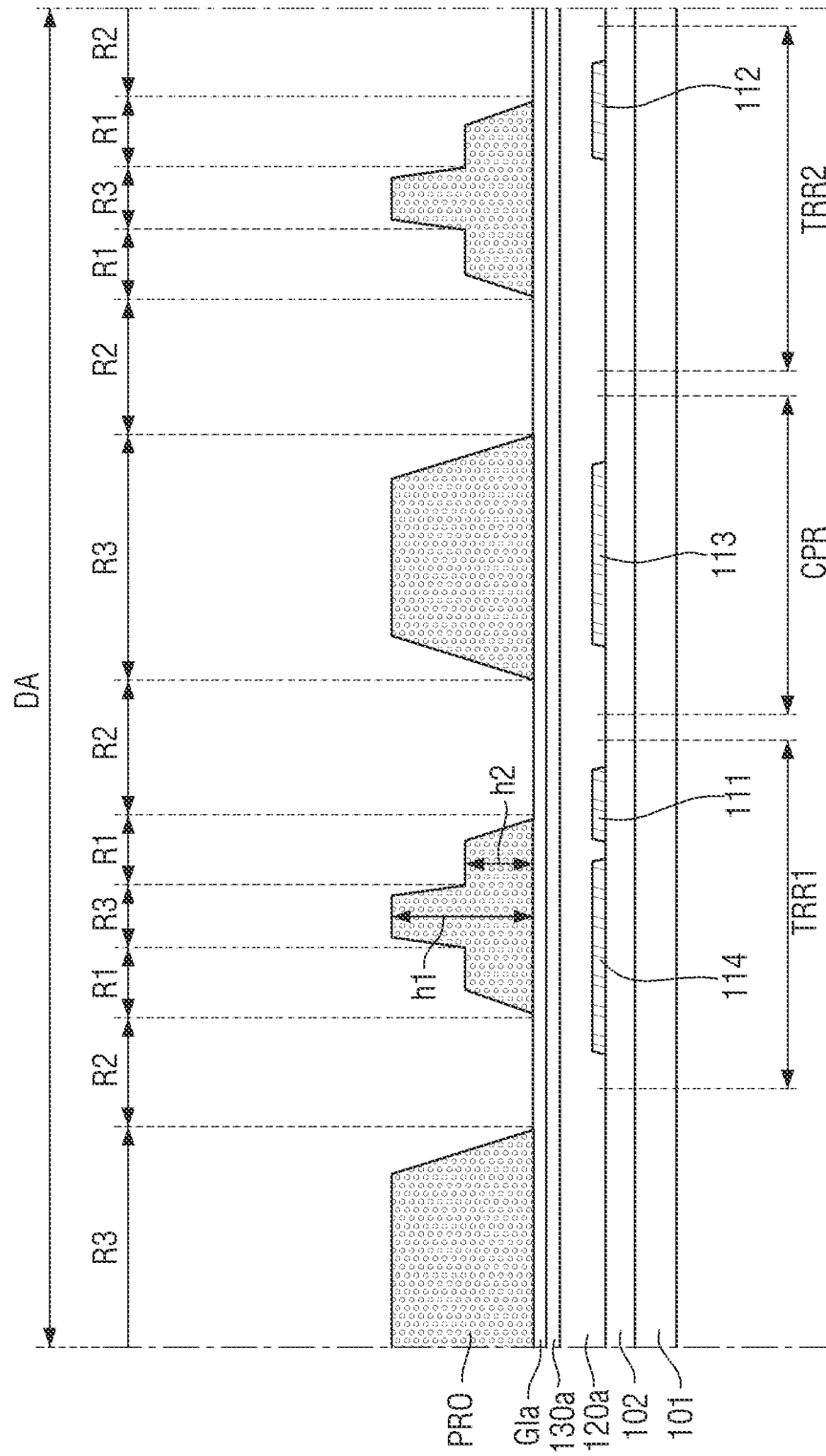
Figure 12:
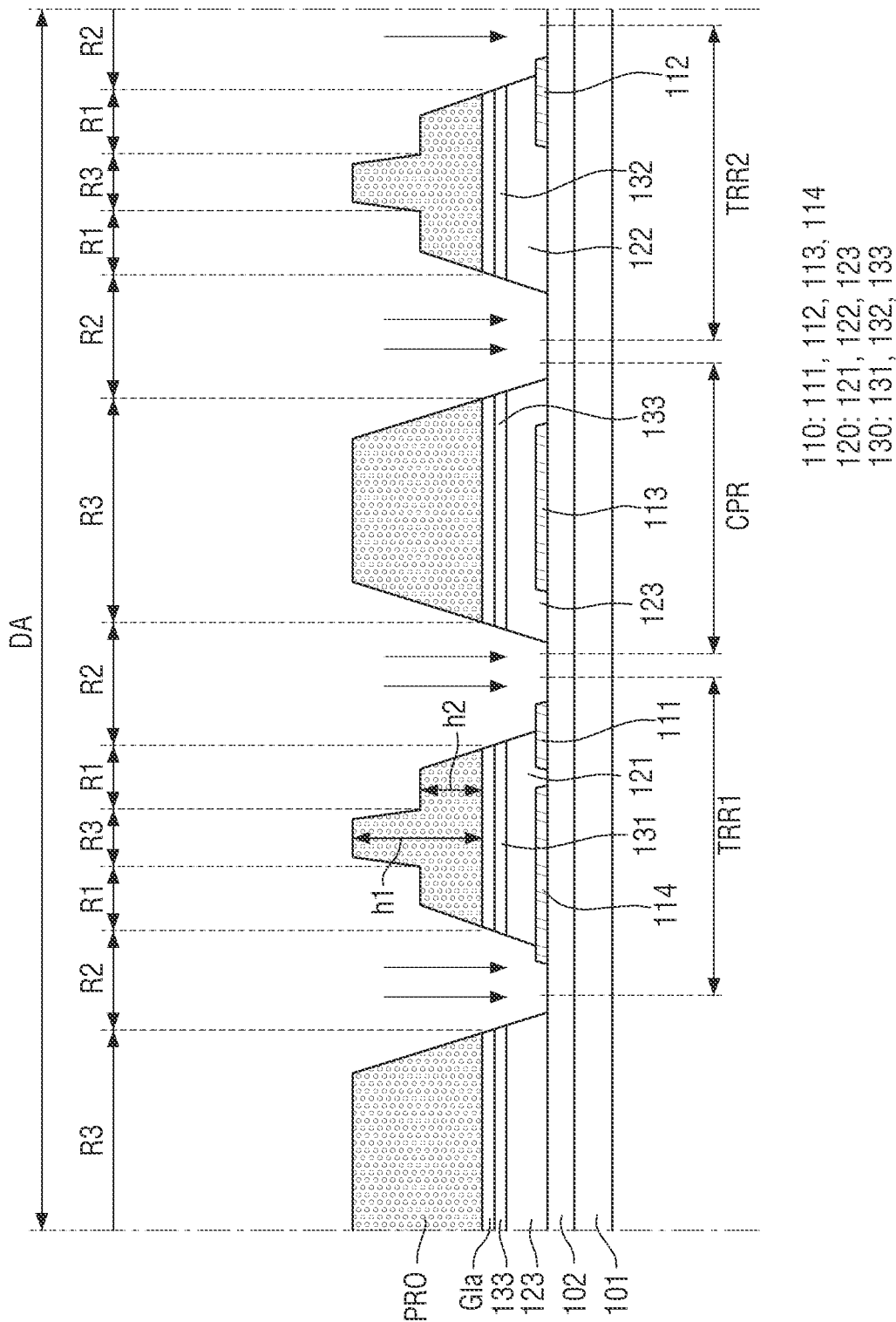
Figure 13:
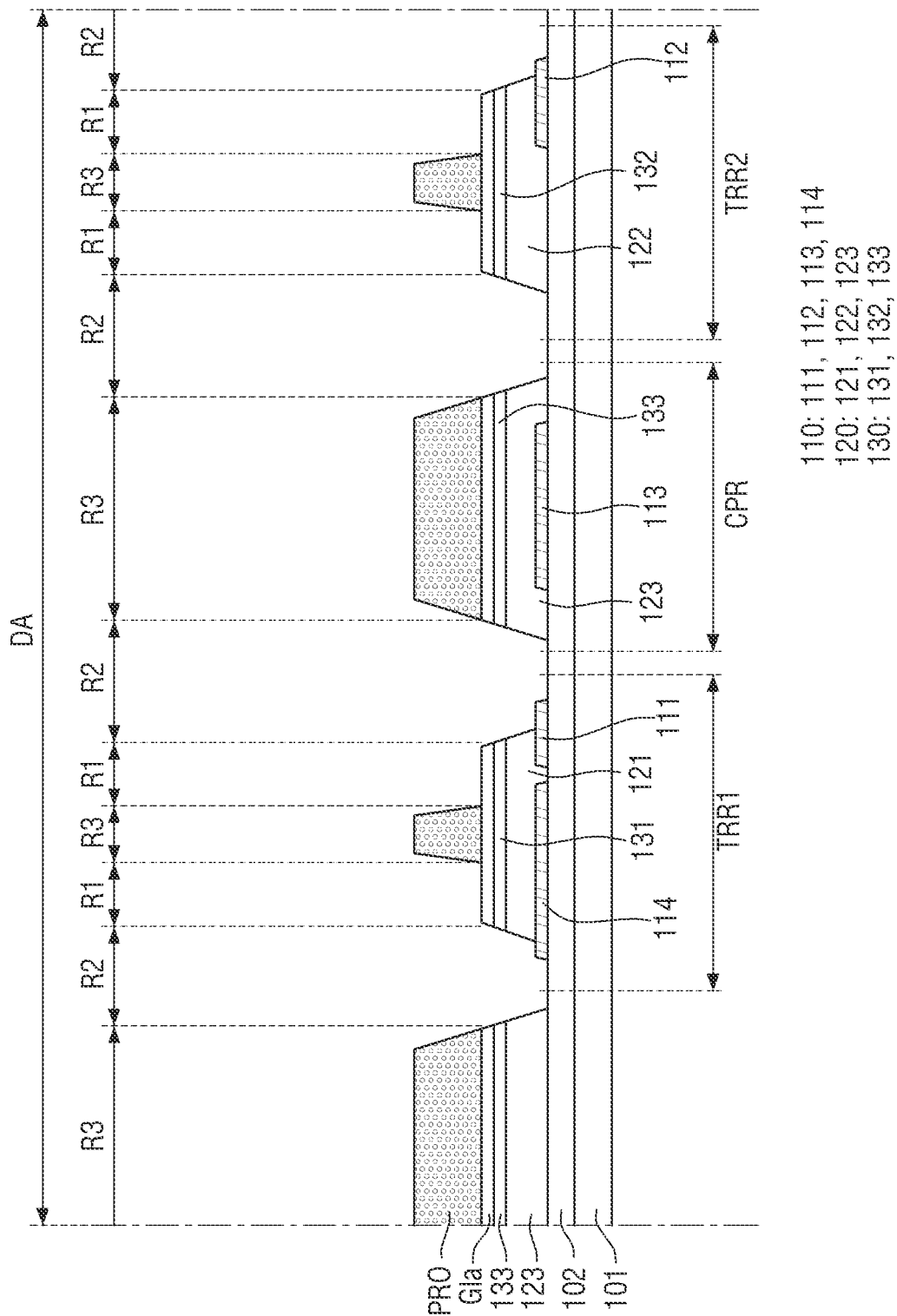
Figure 14:
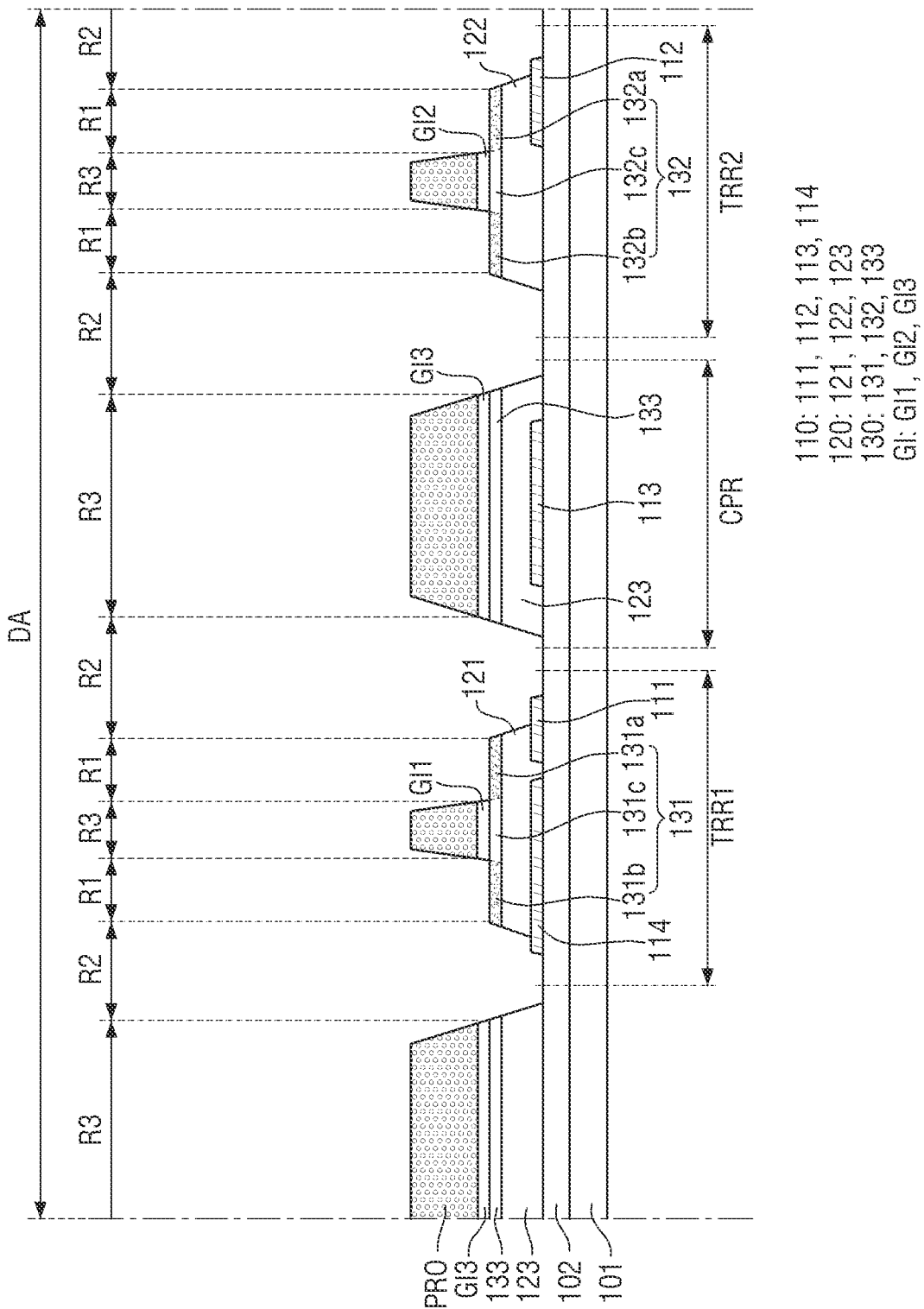

Referring to FIGS. 8 and 9, a barrier layer 102 is formed on the entire surface of a base substrate 101, and a patterned first conductive layer 110 is formed on the barrier layer 102 (operation S01). The patterned first conductive layer 110 may be formed by a mask process. For example, a material layer for a first conductive layer may be deposited on the entire surface of the barrier layer 102 and then patterned through a photolithography process to form the first conductive layer 110 as illustrated in FIG. 9.

Next, referring to FIGS. 10 through 14, a buffer layer material 120a, a semiconductor layer material 130a, and a gate insulating layer material GIa are collectively etched (operation S02) to collectively pattern a buffer layer 120 and a semiconductor layer 130 and then a gate insulating layer GI (operation S03). The above processes (operations SO2 and S03) may be performed using a halftone mask HFM, but the present disclosure is not limited thereto. The buffer layer material 120a, the semiconductor layer material 130a, and the gate insulating layer material GIa may be patterned into the buffer layer 120, the semiconductor layer 130, and the gate insulating layer GI, respectively.

For example, the buffer layer material 120a, the semiconductor layer material 130a and the gate insulating layer material GIa are sequentially coated on the entire surface of the barrier layer 102 to cover the first conductive layer 110, and a photoresist PRO is coated on the gate insulating layer material GIa and then exposed to light using the halftone mask HFM.

The halftone mask HFM may be divided into a light blocking part BL, a first light transmitting part HT, and a second light transmitting part TR according to light transmittance (or transmissivity). The transmittance of the second light transmitting part TR may be greater than that of the first light transmitting part HT.

The photoresist PRO may be divided into a first region R1, a second region R2, and a third region R3. The first region R1 may correspond to the first light transmitting part HT of the halftone mask HFM, and the second region R2 may correspond to the second light transmitting part TR of the halftone mask HFM. In addition, the third region R3 may correspond to the light blocking part BL of the halftone mask HFM.

The light blocking part BL may block light provided from the outside to prevent or reduce the light reaching the third region R3 of the photoresist PRO. The first light transmitting part HT may transmit only a part of the light provided from the outside by controlling the transmittance of the light and allow only the part of the light to reach the first region R1 of the photoresist PRO. The second light transmitting part TR may transmit most of the light provided from the outside and allow most of the light to reach the second region R2 of the photoresist PRO.

For example, in the case of a positive photoresist exposed to light, a sensitizer may be decomposed, and an acid may be formed. As a result, a region in which the sensitizer is decomposed has a characteristic of melting well in a developer. Here, of the photoresist of the substrate, any one of a part exposed to light and a part not exposed to light may be removed using a developer (e.g., a predetermined developer) according to chemical change characteristics of the exposed part and the unexposed part, thereby forming a photoresist pattern.

However, when the halftone mask HFM is used, only a part of the photoresist in a part (e.g., the first region R1) corresponding to a part (e.g., the first light transmitting part HT) that transmits only a part of light provided from the outside may be removed, and the other part of the photoresist may remain without being removed. Therefore, the photoresist PRO of the third region R3 may remain to a first height h1, and the photoresist PRO of the first region R1 may remain to a second height h2. The first height h1 may be greater than the second height h2. In addition, the photoresist of the second region R2 may be completely removed to expose a part of an upper surface of the gate insulating layer material GIa in the second region R2. In the case of a negative photoresist, the photoresist PRO may remain to opposite heights in the third region R3 and the first region R1.

Next, the gate insulating layer material GIa, the semiconductor layer material 130a and the buffer layer material 120a are collectively etched in the second region R2 from which the photoresist PRO has been completely removed.

For example, the gate insulating layer material GIa, the semiconductor layer material 130a and the buffer layer material 120a are collectively etched in the second region R2 from which the photoresist PRO has been completely removed to form the semiconductor layer 130 and the buffer layer 120. In the process of etching the gate insulating layer material GIa, the semiconductor layer material 130a and the buffer layer material 120a, the etching of the semiconductor layer material 130a may result in the formation of a semiconductor pattern 131 of a first transistor TR1, a semiconductor pattern 132 of a second transistor TR2, a semiconductor dummy part 133, a first semiconductor opening OPS1, and a second semiconductor opening OPS2. In addition, the etching of the buffer layer material 120a in the above process may result in the formation of a first buffer region 121, a second buffer region 122, a third buffer region 123, a first buffer opening OPB1, and a second buffer opening OPB2.

Next, after the gate insulating layer material GIa, the semiconductor layer material 130a, and the buffer layer material 120a are collectively etched, an ashing process is performed. Then, the gate insulating layer GI is patterned.

For example, the ashing process may partially remove the photoresist PRO of the third region R3 to leave an amount (e.g., a predetermined amount) of the photoresist PRO while completely removing the photoresist PRO of the first region R1. Accordingly, the gate insulating layer material GIa of the third region R3 may not be exposed, but the gate insulating layer material GIa of the first region R1 may be exposed.

The exposed gate insulating layer material GIa of the first region R1 may be removed by etching, thereby forming the gate insulating layer GI including a first gate insulating layer region GI1, a second gate insulating layer region GI2, and a third gate insulating layer region GI3.

As described above, according to some example embodiments, the gate insulating layer GI, the semiconductor layer 130, and the buffer layer 120 may be formed by one mask process. That is, because a separate mask process for forming each of the gate insulating layer GI, the semiconductor layer 130, and the buffer layer 120 is not necessary, the number of mask processes can be reduced, thereby improving process efficiency.

Figure 15:
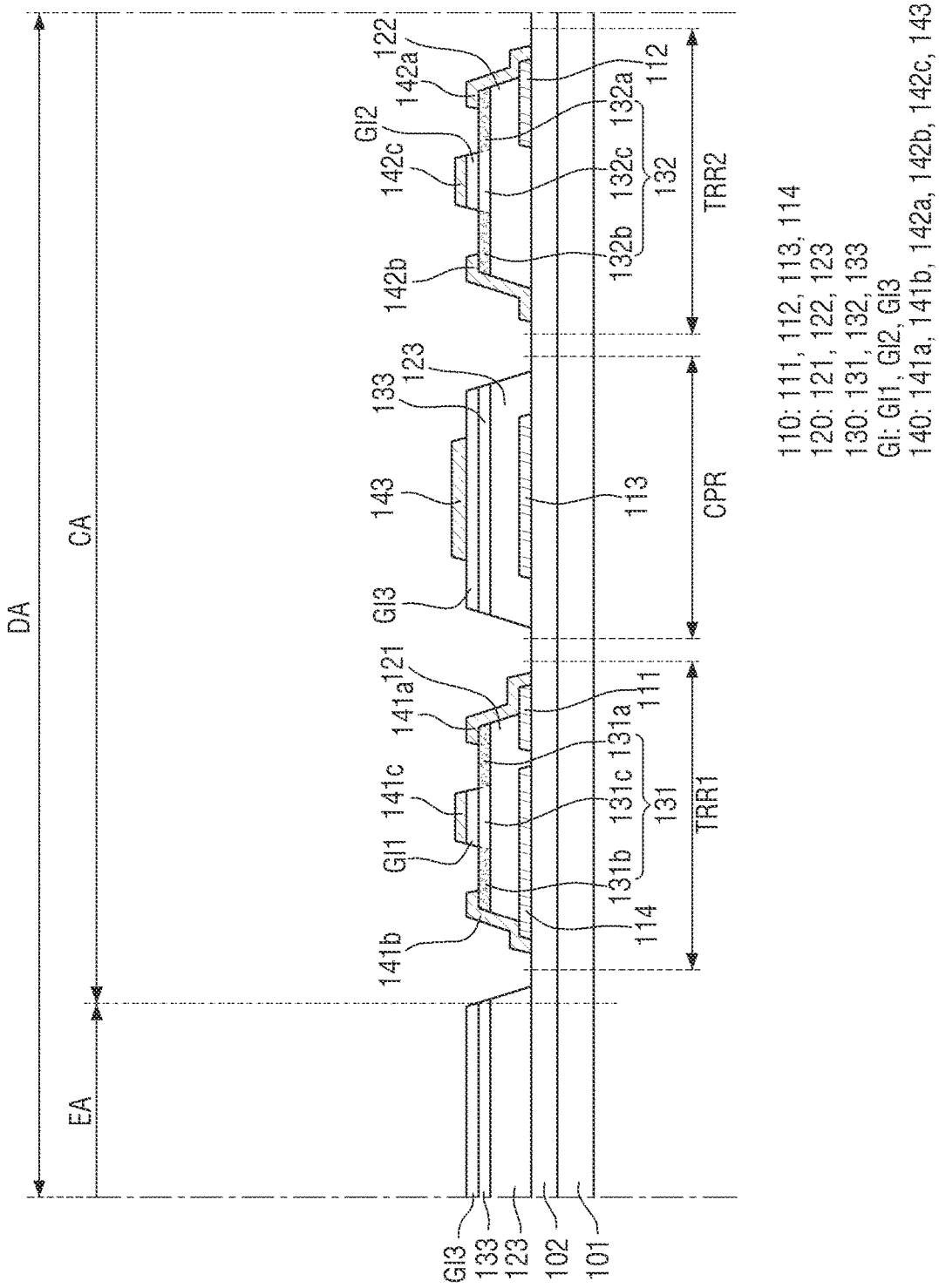

Next, referring to FIG. 15, a patterned second conductive layer 140 is formed on the gate insulating layer GI (operation S04). The patterned second conductive layer 140 may be formed by a mask process. For example, a material layer for a second conductive layer is deposited on the entire surface of the gate insulating layer GI. In the deposition process, the material layer for the second conductive layer may also be deposited on an upper surface and/or side surfaces of the semiconductor layer 130, side surfaces of the buffer layer 120, and an upper surface and/or side surfaces of the first conductive layer 110. Therefore, first and second source/drain electrodes 141a and 141b of the first transistor TR1 and first and second source/drain electrodes 142a and 142b of the second transistor TR2 may be physically and/or electrically connected to the semiconductor pattern 131 of the first transistor TR1 and the semiconductor pattern 132 of the second transistor TR2, respectively. Furthermore, the first and second source/drain electrodes 141a and 141b of the first transistor TR1 and the first and second source/drain electrodes 142a and 142b of the second transistor TR2 may be physically and/or electrically connected to a first power wiring 111, a lower light blocking pattern 114, and a data wiring 112, respectively.

Next, a photoresist layer is coated on the material layer for the second conductive layer and exposed and developed to form a photoresist pattern. Then, the material layer for the second conductive layer is etched using the photoresist pattern as an etch mask. Next, the photoresist pattern is removed through a strip or ashing process to complete the patterned second conductive layer 140 as illustrated in FIG. 15.

Figure 16:
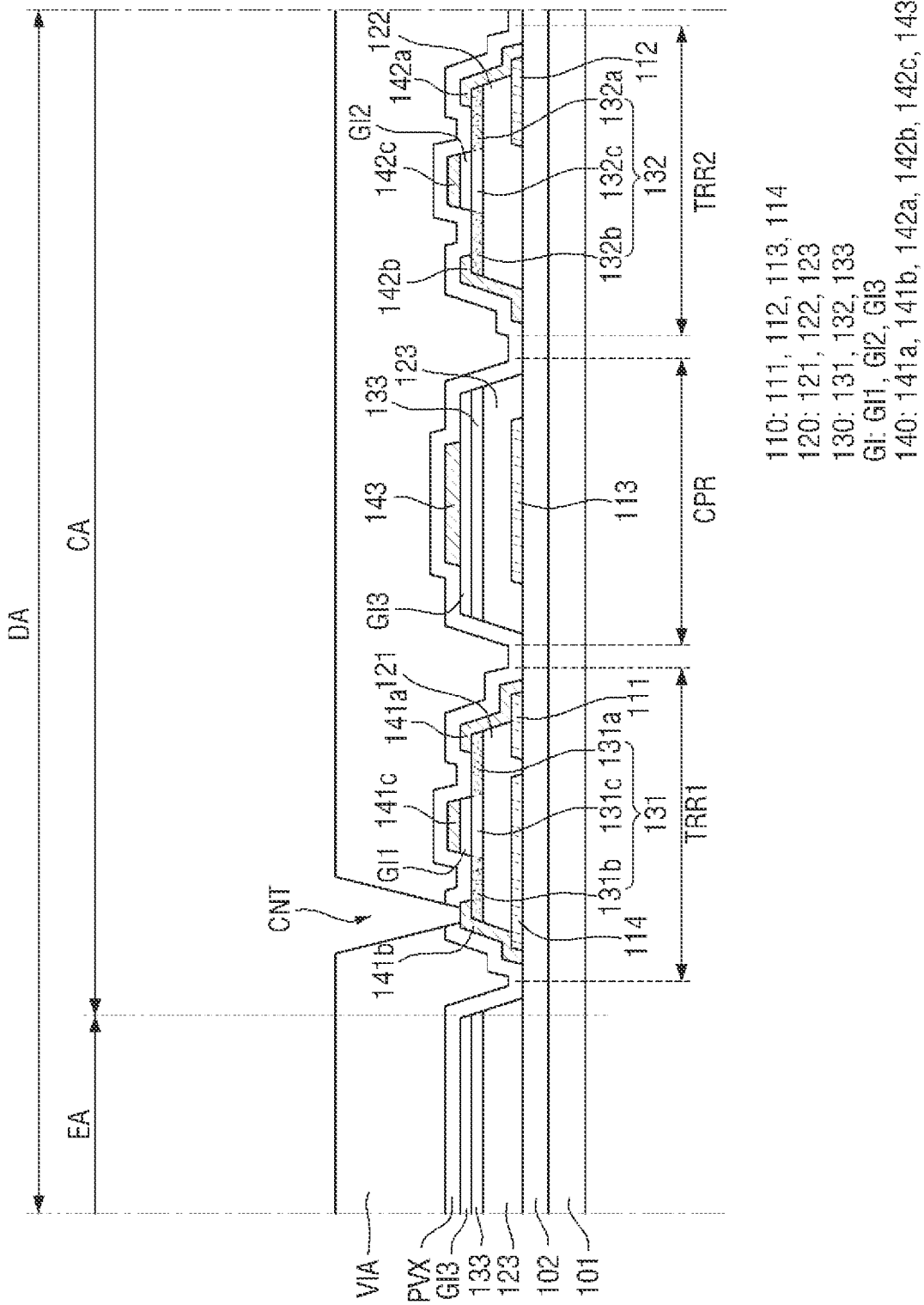

Next, referring to FIG. 16, a passivation layer PVX and a via layer VIA are formed on the second conductive layer 140, and a contact hole CNT is formed to expose a part of the second source/drain electrode 141b of the first transistor TR1 (operation S05).

For example, the passivation layer PVX is deposited on an upper surface and/or side surfaces of the gate insulating layer GI, the upper surface and/or the side surfaces of the semiconductor layer 130, the side surfaces of the buffer layer 120, the upper surface and/or the side surfaces of the first conductive layer 110 and an upper surface of the barrier layer 102 to cover the second conductive layer 140. After the passivation layer PVX is deposited, a material layer for a via layer is coated to form the via layer VIA. Then, the via layer VIA and the passivation layer PVX are etched to form the contact hole CNT that penetrates the via layer VIA and the passivation layer PVX to expose a part of the second source/drain electrode 141b of the first transistor TR1.

Figure 17:
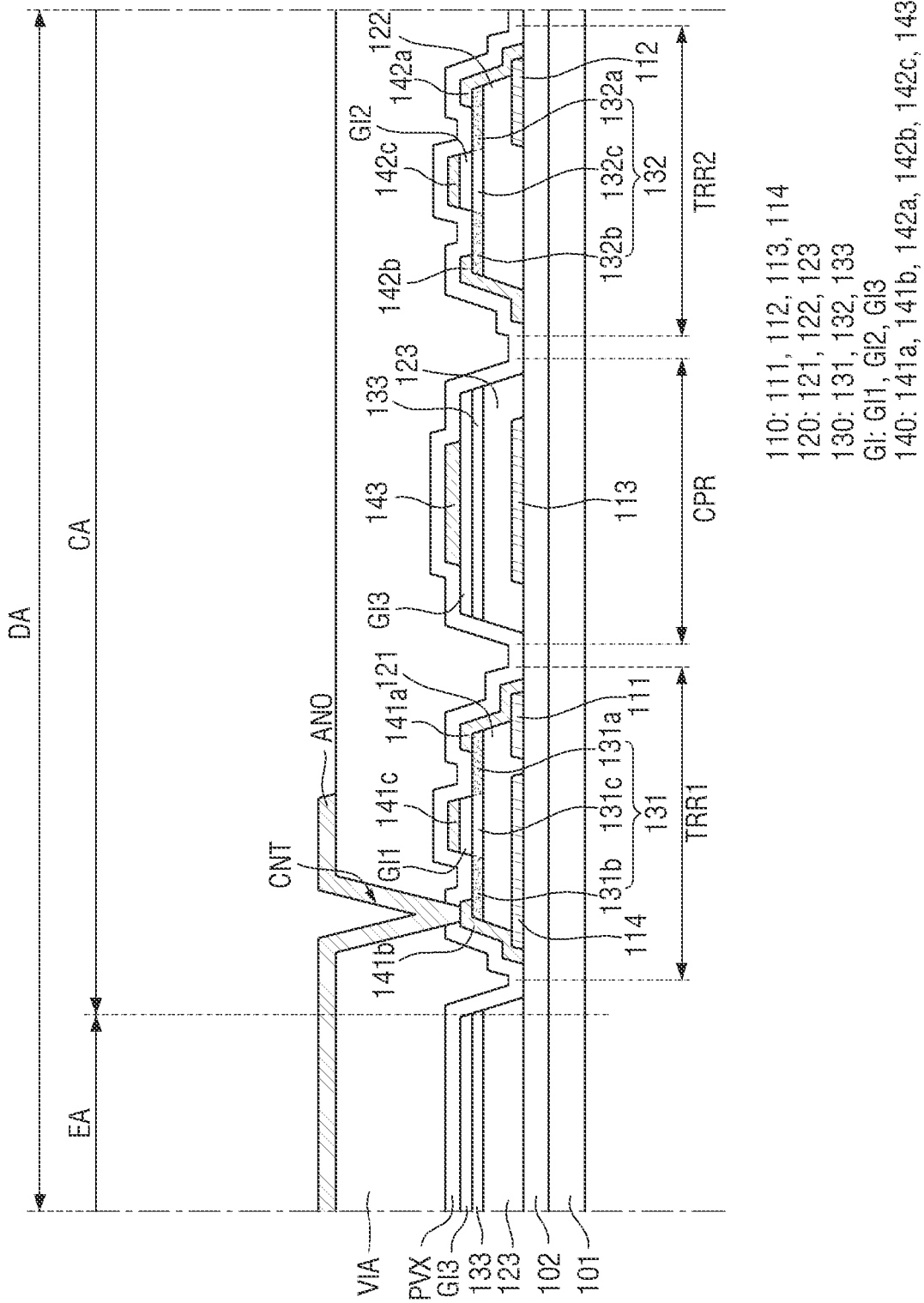

Next, referring to FIG. 17, an anode ANO is formed on the via layer VIA (operation S06).

The anode ANO may be formed by a mask process. For example, a material layer for an anode is deposited on the entire surface of the via layer VIA. In the deposition process, the material layer for the anode may be deposited into the contact hole CNT. Therefore, the anode ANO may be connected to the second source/drain electrode 141b of the first transistor TR1. Next, a photoresist layer is coated on the material layer for the anode and exposed and developed to form a photoresist pattern. Then, the material layer for the anode is etched using the photoresist pattern as an etch mask. Next, the photoresist pattern is removed through a strip or ashing process to complete the patterned anode ANO as illustrated in FIG. 17.

Figure 18:
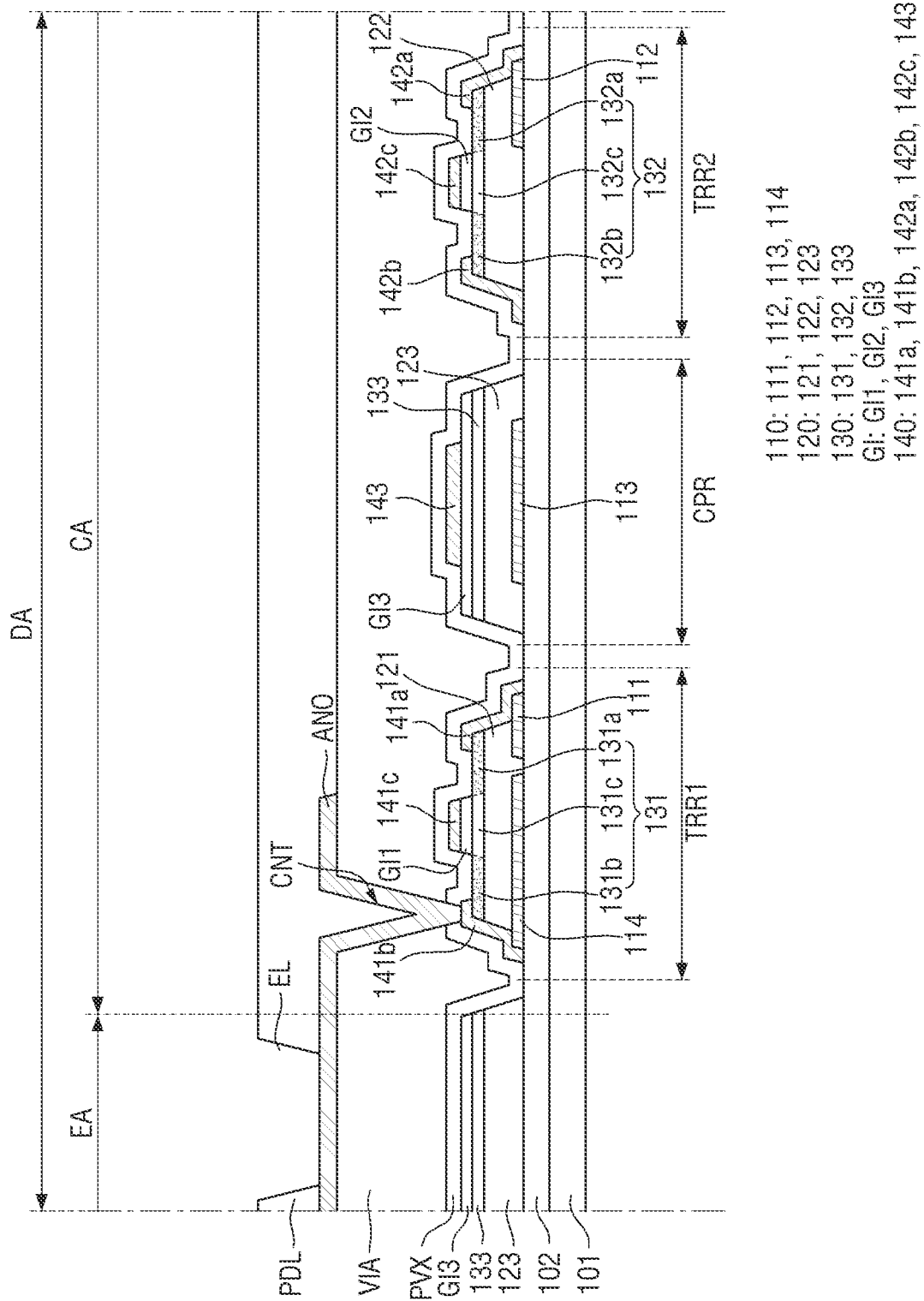

Next, referring to FIG. 18, a patterned pixel defining layer PDL is formed on the via layer VIA to cover the anode ANO (operation S07).

For example, the pixel defining layer PDL may include, for example, an organic material including a photosensitive material. In this case, the patterned pixel defining layer PDL may be formed by coating an organic material layer for a pixel defining layer and exposing and developing the organic material layer for the pixel defining layer.

The pixel defining layer PDL may be formed along a boundary of a pixel PX and may partially overlap the anode ANO. The pixel defining layer PDL may be formed to overlap the contact hole CNT. When the anode ANO only partially fills an inner space of the contact hole CNT instead of completely filling the inner space, the pixel defining layer PDL may completely fill the inner space of the contact hole CNT.

Hereinafter, other embodiments will be described. In the following embodiments, a description of the same elements as those described above will be omitted or given briefly, and differences will be mainly described.

Figure 19:
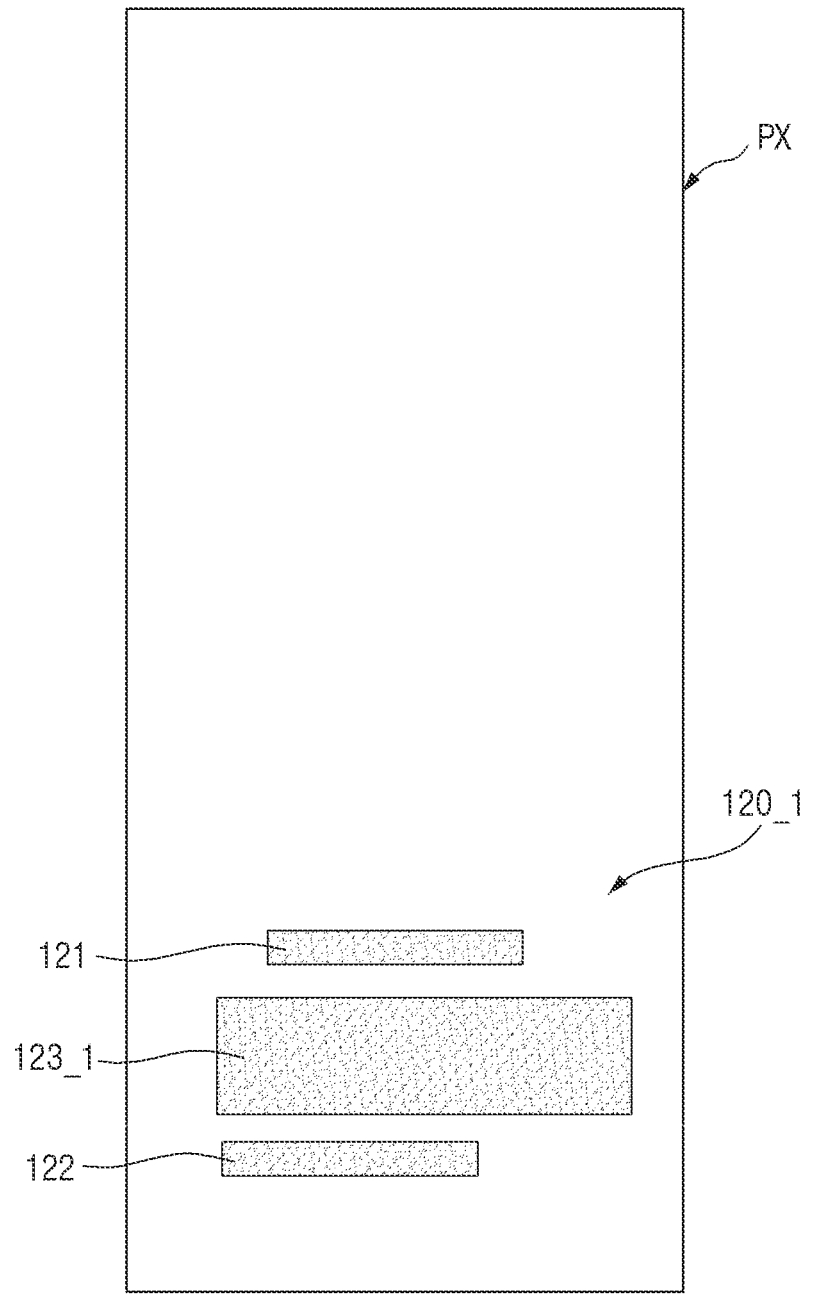
FIG. 19 is a layout view of a buffer layer according to some example embodiments.
Figure 20:
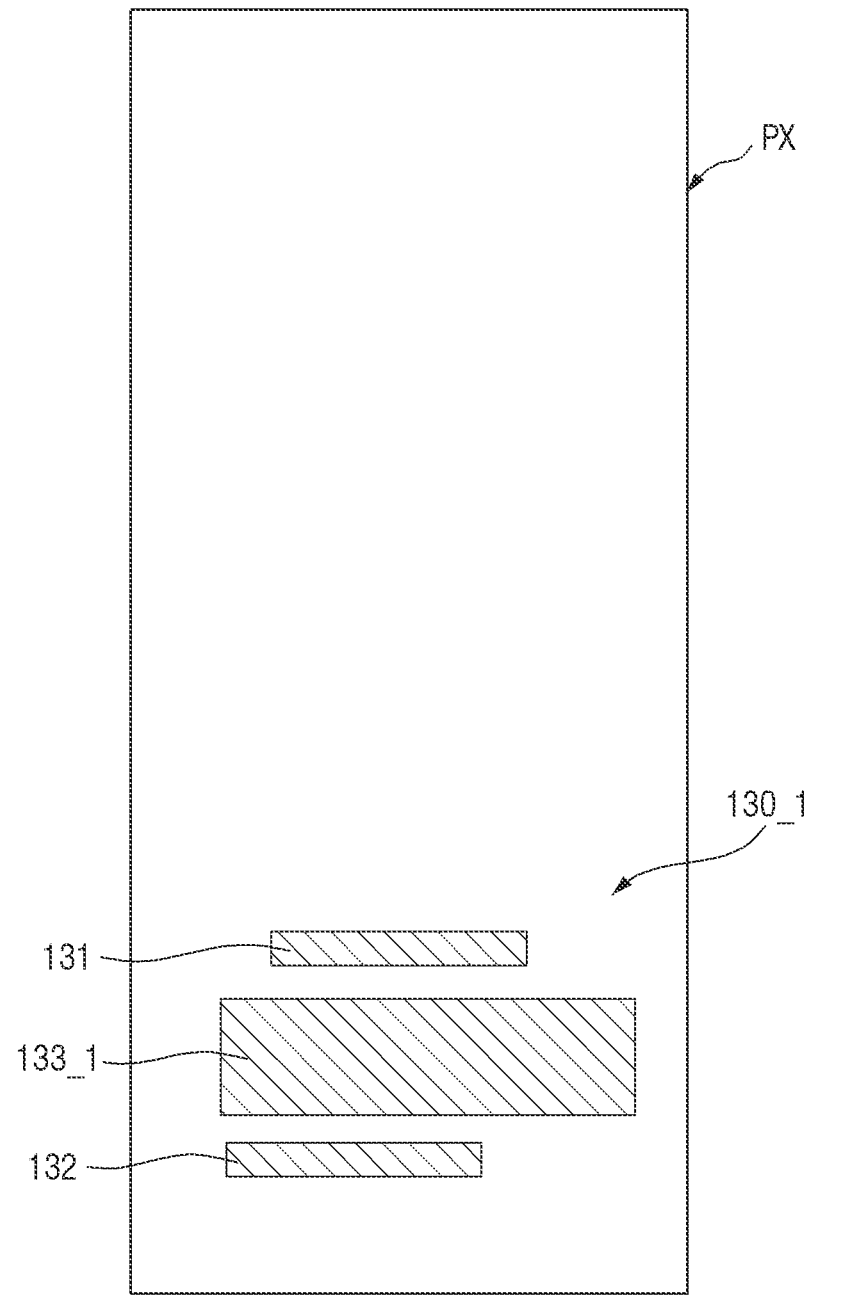
FIG. 20 is a layout view of a semiconductor layer according to some example embodiments.
Figure 21:
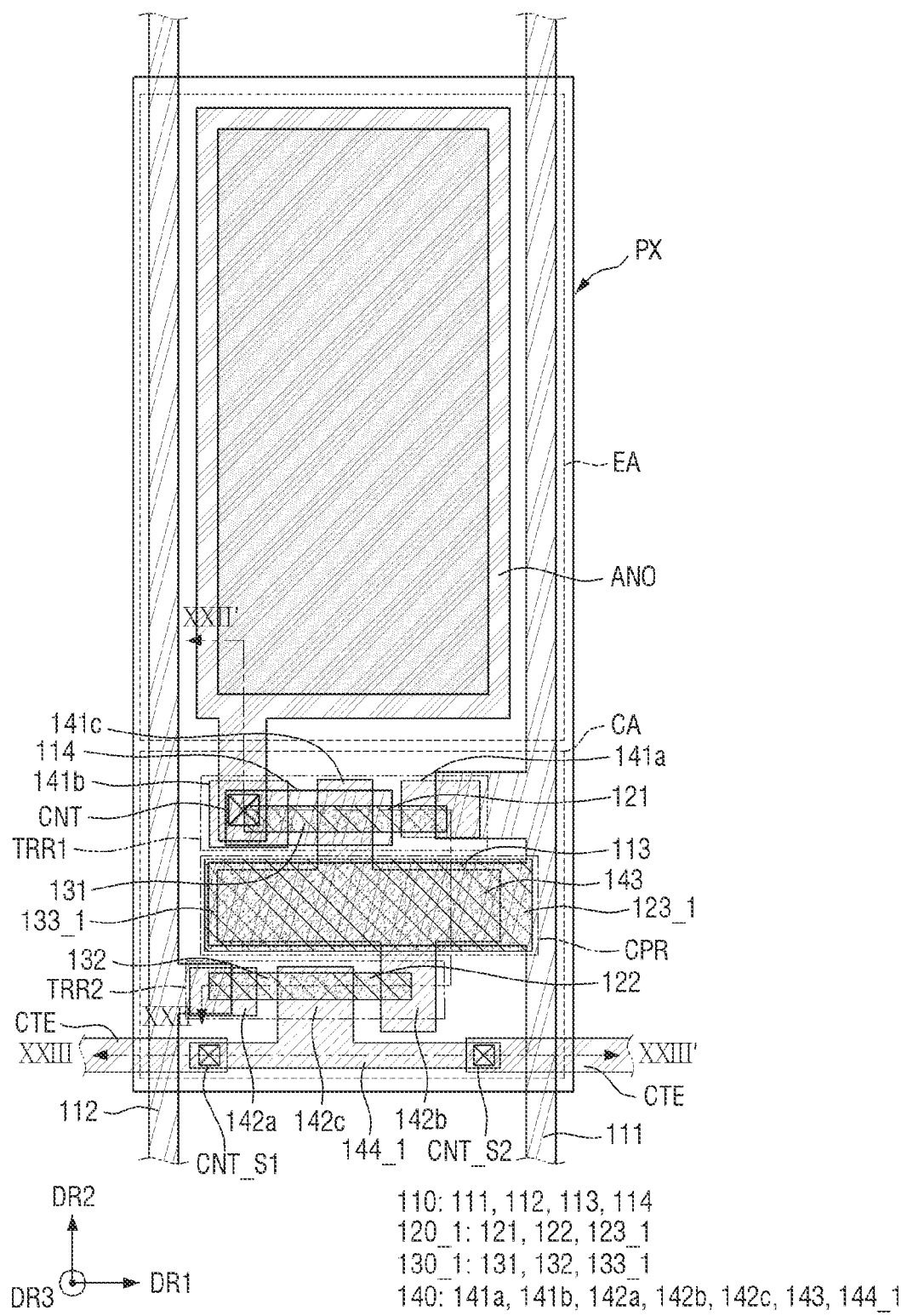
FIG. 21 is a layout view of one pixel of a display device according to some example embodiments.
Figure 22:
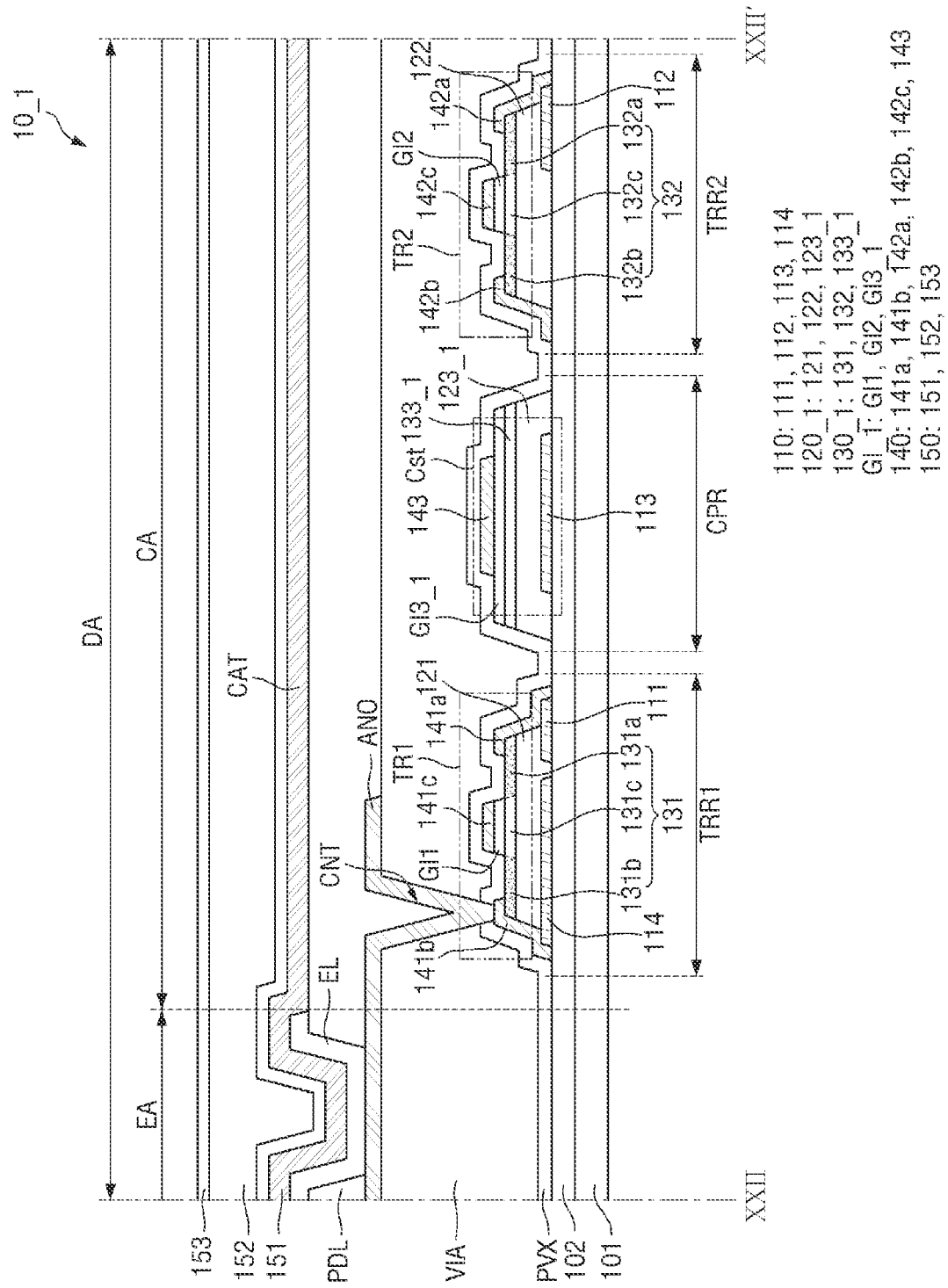
FIG. 22 is a cross-sectional view taken along the line XXII-XXII' of FIG. 21.
Figure 23:
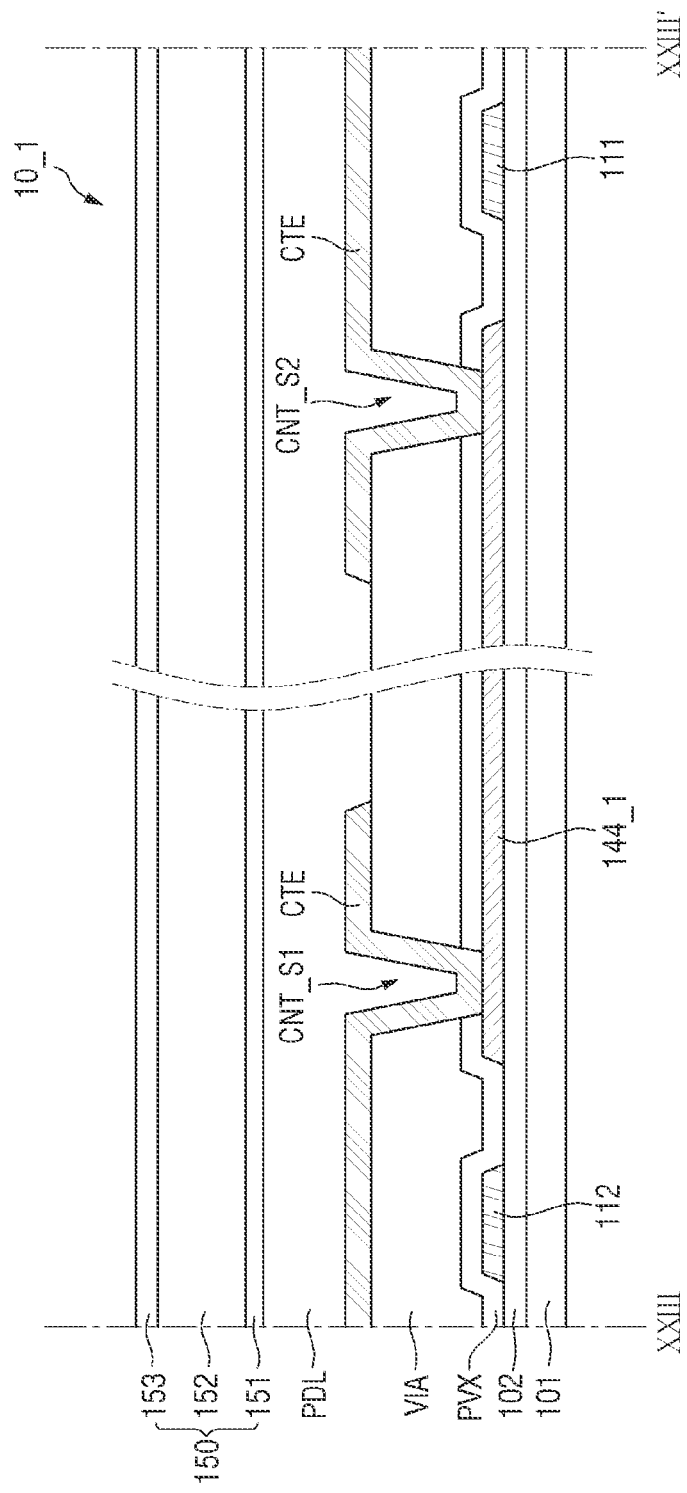
FIG. 23 is a cross-sectional view taken along the line XXIII-XXIII' of FIG. 21.

FIG. 19 is a layout view of a buffer layer 120_1 according to some example embodiments. FIG. 20 is a layout view of a semiconductor layer 130_1 according to some example embodiments. FIG. 21 is a layout view of one pixel PX of a display device according to some example embodiments. FIG. 22 is a cross-sectional view taken along the line XXII-XXII' of FIG. 21. FIG. 23 is a cross-sectional view taken along the line XXIII-XXIII' of FIG. 21.

Referring to FIGS. 19 through 23, the current embodiment is different from the embodiment of FIG. 4 in that a third buffer region 123_1 of the buffer layer 120_1, a semiconductor dummy part 133_1 of the semiconductor layer 130_1 and a third gate insulating layer region GI3_1 of a gate insulating layer GI_1 arranged in a display panel 10_1 are arranged in only a portion of a circuit area CA.

For example, the buffer layer 120_1 includes a first buffer region 121, a second buffer region 122 and the third buffer region 123_1, the semiconductor layer 130_1 includes a semiconductor pattern 131 of a first transistor TR1, a semiconductor pattern 132 of a second transistor TR2 and the semiconductor dummy part 133_1, and the gate insulating layer GI_1 includes a first gate insulting layer region GI1, a second gate insulating layer region GI2 and the third gate insulating layer region GI3_1. Here, the third buffer region123_1, the semiconductor dummy part 133_1, and the third gate insulating layer region GI3_1 may be arranged only in a capacitor region CPR. That is, the third buffer region 123_1, the semiconductor dummy part 133_1, and the third gate insulating layer region GI3_1 may not be arranged in a region excluding a first transistor region TRR1, a second transistor region TRR2, and the capacitor region CPR.

In this case, a scan wiring 144_1 may be located only in one pixel PX without extending to another pixel PX neighboring the pixel PX in the first direction DR1. The scan wiring 144_1 may not be directly connected to the scan wiring 144_1 of the neighboring pixel PX but may be electrically connected to the scan wiring 144_1 of the neighboring pixel PX by a connection wiring CTE and contact holes CNT_S1 and CNT_S2 located on a different layer from the scan wiring 144_1, a first power wiring 111 and a data wiring 112.

The connection wiring CTE may be formed on a via layer VIA and electrically connected to the scan wiring 144_1 of the pixel PX through the contact holes CNT_S1 and CNT_S2 that penetrate the via layer VIA and a passivation layer PVX to expose the scan wiring 144_1. Here, one connection wiring CTE may be electrically connected not only to the scan wiring 144_1 of the pixel PX but also to the scan wiring 144_1 of another pixel PX neighboring the pixel PX in the first direction DR1. Accordingly, even if the scan wiring 144_1 is arranged only in the pixel PX, it may be electrically connected to the scan wiring 144_1 of the neighboring pixel PX by the connection wiring CTE.

The connection wiring CTE may intersect the first power wiring 111 and the data wiring 112. The passivation layer PVX and the via layer VIA are arranged between the connection wiring CTE and each of the first power wiring 111 and the data wiring 112 to insulate the connection wiring CTE from each of the first power wiring 111 and the data wiring 112. That is, even if the third buffer region 123_1, the semiconductor dummy part 133_1 and the third gate insulating layer region GI3_1 are arranged only in the capacitor region CPR, the scan wiring 144_1 of the pixel PX may be electrically connected to the scan wiring 144_1 of a neighboring pixel PX by the connection wiring CTE without a short (or a short-circuit) with the first power wiring 111 and the data wiring 112.

The connection wiring CTE may be formed together with an anode ANO by using the same mask. The contact holes CNT_S1 and CNT_S2 electrically connecting the connection wiring CTE and the scan wiring 144_1 may be formed together with a contact hole CNT electrically connecting the anode ANO and a second source/drain electrode 141b of the first transistor TR1 by using the same mask. Therefore, a separate mask for forming the connection wiring CTE or the contact holes CNT_S1 and CNT_S2 is unnecessary.

In this case, because a separate mask process for forming each of the gate insulating layer GI_1, the semiconductor layer 130_1 and the buffer layer 120_1 is also not necessary, the number of mask processes can be reduced, thereby improving process efficiency.

According to some example embodiments, the first power wiring 111 and the data wiring 112 extend to a neighboring pixel PX, the scan wiring 144_1 is located only in the pixel PX without extending to the neighboring pixel PX, and the scan wiring 144_1 of the pixel PX is electrically connected to the scan wiring 144_1 of the neighboring pixel PX by the connection wiring CTE as described above. However, the present disclosure is not limited thereto, and the scan wiring 144_1 may also extend to another pixel PX neighboring the pixel PX in the first direction DR1, and the first power wiring 111 and the data wiring 112 may also be located only in the pixel PX and electrically connected to the first power wiring 111 and the data wiring 112 of the neighboring pixel PX by the connection wiring CTE.

Figure 24:
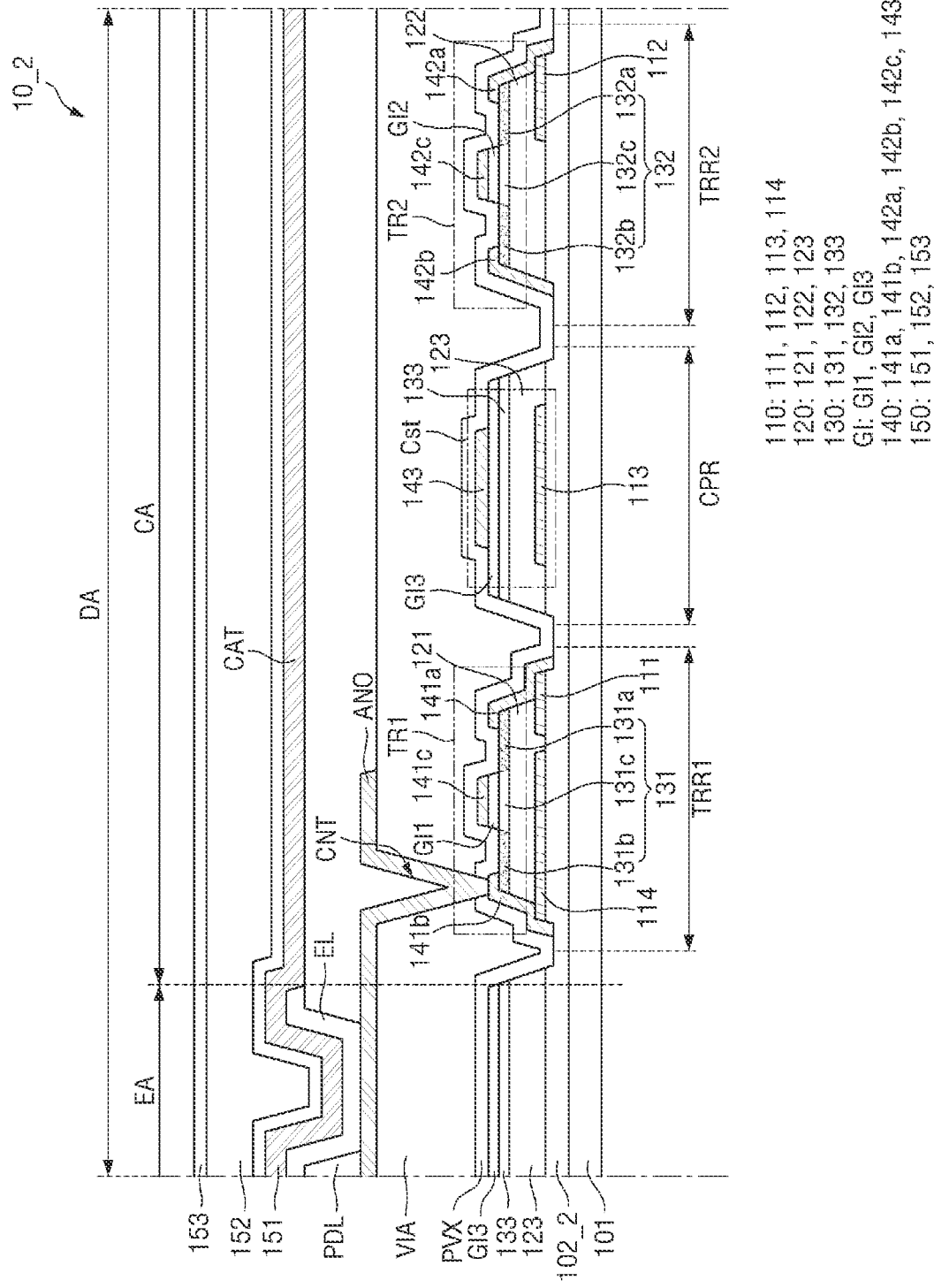

FIG. 24 is a cross-sectional view of a display panel 10_2 according to some example embodiments.

Referring to FIG. 24, the current embodiment is different from the embodiment of FIG. 7 in that a part of an upper surface of a barrier layer 102_2 arranged in the display panel 10_2 is etched.

For example, in an etching process for patterning a buffer layer 120 and a semiconductor layer 130, a buffer layer material 120a (see FIG. 12) may be etched to pattern the buffer layer 120, and then the exposed barrier layer 102_2 may be further etched. In this case, not only side surfaces of the buffer layer 120 and side surfaces of the semiconductor layer 130 but also side surfaces of some regions of the etched barrier layer 102_2 may be aligned. In addition, a thickness of at least a part of the barrier layer 102_2 in a region overlapping a first semiconductor opening OPS_1, a second semiconductor opening OPS_2, a first buffer opening OPB_1 or a second buffer opening OPB_2 may be smaller than a thickness of the other part of the barrier layer 102_2.

In this case, because a separate mask process for forming each of a gate insulating layer GI, the semiconductor layer 130 and the buffer layer 120 is also not necessary, the number of mask processes can be reduced, thereby improving process efficiency.

FIG. 25 is a cross-sectional view of a display panel 10_3 according to some example embodiments.

Referring to FIG. 25, the current embodiment is different from the embodiment of FIG. 7 in that a buffer layer 120_3 arranged in the display panel 10_3 does not expose a barrier layer 102 located under the buffer layer 120_3.

For example, in an etching process for patterning the buffer layer 120_3, a buffer layer material 120a (see FIG. 12) may not be completely removed but may remain to a small thickness. In this case, a first buffer region 121, a second buffer region 122 and a third buffer region 123 of the buffer layer 120_3 may be connected. However, a thickness of the buffer layer 120_3 arranged between the first buffer region 121, the second buffer region 122 and the third buffer region 123 may be smaller than a thickness of each of the first buffer region 121, the second buffer region 122 and the third buffer region 123.

In this case, an upper surface and/or side surfaces of a first conductive layer 110 may also be partially exposed, and the first conductive layer 110 may also be electrically connected to a semiconductor pattern 131 of a first transistor TR1 and a semiconductor pattern 132 of a second transistor TR2 by a second conductive layer 140.

In this case, because a separate mask process for forming each of a gate insulating layer GI, a semiconductor layer 130 and the buffer layer 120_3 is also not necessary, the number of mask processes can be reduced, thereby improving process efficiency.

While the embodiments of the present disclosure have been described with reference to the accompanying drawings, it will be understood by those skilled in the art that various modifications can be made without departing from the scope of the present disclosure and without changing essential features. Therefore, the above-described embodiments should be considered in a descriptive sense only and not for purposes of limitation.

What is claimed is:

1. A method of fabricating a display device comprising a plurality of pixels and a first transistor and a second transistor in each of the pixels, the method comprising:

forming a first conductive layer, which comprises a first power wiring electrically connected to a first source/drain electrode of the first transistor, a lower light blocking pattern electrically connected to a second source/drain electrode of the first transistor and a data wiring electrically connected to a first source/drain electrode of the second transistor, on a substrate;

sequentially coating an insulating layer material, a semiconductor layer material and a gate insulating layer material on the substrate to cover the first conductive layer; and etching the gate insulating layer material, the semiconductor layer material and the insulating layer material by using a halftone mask to pattern a gate insulating layer which comprises a gate insulating layer of the first transistor and a gate insulating layer of the second transistor, a semiconductor layer which comprises a semiconductor pattern of the first transistor and a semiconductor pattern of the second transistor, and an insulating layer which comprises a first insulating pattern having the same planar shape as the semiconductor pattern of the first transistor and a second insulating pattern having a same planar shape as the semiconductor pattern of the second transistor.

2. The method of claim 1, wherein in the patterning of the gate insulating layer, the semiconductor layer and the insulting layer, the gate insulating layer, the semiconductor layer and the insulting layer are etched to expose at least a portion of the substrate.

3. The method of claim 2, wherein the first insulating pattern and the second insulating pattern are formed in an island shape and spaced apart from each other.

4. The method of claim 1, wherein the insulating layer further comprises a third insulating pattern, and the third insulating pattern is spaced apart from the first insulating pattern and the second insulating pattern and formed over a plurality of pixels.

5. The method of claim 1, further comprising, after the patterning of the gate insulating layer, the semiconductor layer and the insulating layer, forming a second conductive layer which comprises the first source/drain electrode, the second source/drain electrode and a gate electrode of the first transistor and the first source/drain electrode, a second source/drain electrode and a gate electrode of the second transistor.

* * * * *